(12) United States Patent
Yamazoe

(10) Patent No.: US 10,073,936 B2
(45) Date of Patent: Sep. 11, 2018

(54) CALCULATION METHOD, GENERATION METHOD, PROGRAM, EXPOSURE METHOD, AND MASK FABRICATION METHOD

(71) Applicant: CANON KABUSHIKI KAISHA, Tokyo (JP)

(72) Inventor: Kenji Yamazoe, Berkeley, CA (US)

(73) Assignee: Canon Kabushiki Kaisha, Tokyo (JP)

( * ) Notice: Subject to any disclaimer, the term of this patent is extended or adjusted under 35 U.S.C. 154(b) by 620 days.

(21) Appl. No.: 14/542,166

(22) Filed: Nov. 14, 2014

(65) Prior Publication Data

US 2015/0070669 A1 Mar. 12, 2015

Related U.S. Application Data

(62) Division of application No. 13/248,480, filed on Sep. 29, 2011, now Pat. No. 8,908,153, which is a division of application No. 12/241,702, filed on Sep. 30, 2008, now Pat. No. 8,059,262.

(30) Foreign Application Priority Data

Oct. 3, 2007 (JP) .................................. 2007-260360

(51) Int. Cl.
*G03B 27/32* (2006.01)
*G03B 27/54* (2006.01)
*G06F 17/50* (2006.01)
*G03F 7/20* (2006.01)

(52) U.S. Cl.
CPC .......... *G06F 17/5045* (2013.01); *G03F 7/705* (2013.01); *G03F 7/70058* (2013.01); *G03F 7/70091* (2013.01); *G03F 7/70666* (2013.01)

(58) Field of Classification Search
CPC .. G03F 7/705; G03F 7/70058; G03F 7/70091; G03F 7/70666
USPC ...................................... 355/67, 77
See application file for complete search history.

(56) References Cited

U.S. PATENT DOCUMENTS

2004/0265707 A1* 12/2004 Socha ................ G03F 7/70091
430/5

FOREIGN PATENT DOCUMENTS

EP 2146249 A1 1/2010

* cited by examiner

*Primary Examiner* — Colin Kreutzer
(74) *Attorney, Agent, or Firm* — Canon USA Inc., IP Division

(57) ABSTRACT

A generation method of generating, by a computer, data of a pattern of a mask used for an exposure apparatus including a projection optical system. The method includes dividing an effective light source formed on a pupil plane of the projection optical system into a plurality of point sources; generating a plurality of shifted pupil functions by shifting a pupil function corresponding to each of the plurality of point sources by a shift amount in accordance with a position of each point source; defining a matrix by arranging each of the plurality of shifted pupil functions in each row or each column of the matrix; calculating an eigenvalue and an eigenfunction by performing singular value decomposition of the matrix; calculating a map representing, when elements of a target pattern are inserted on an object plane of the projection optical system, an influence the elements inflict on each other.

14 Claims, 26 Drawing Sheets

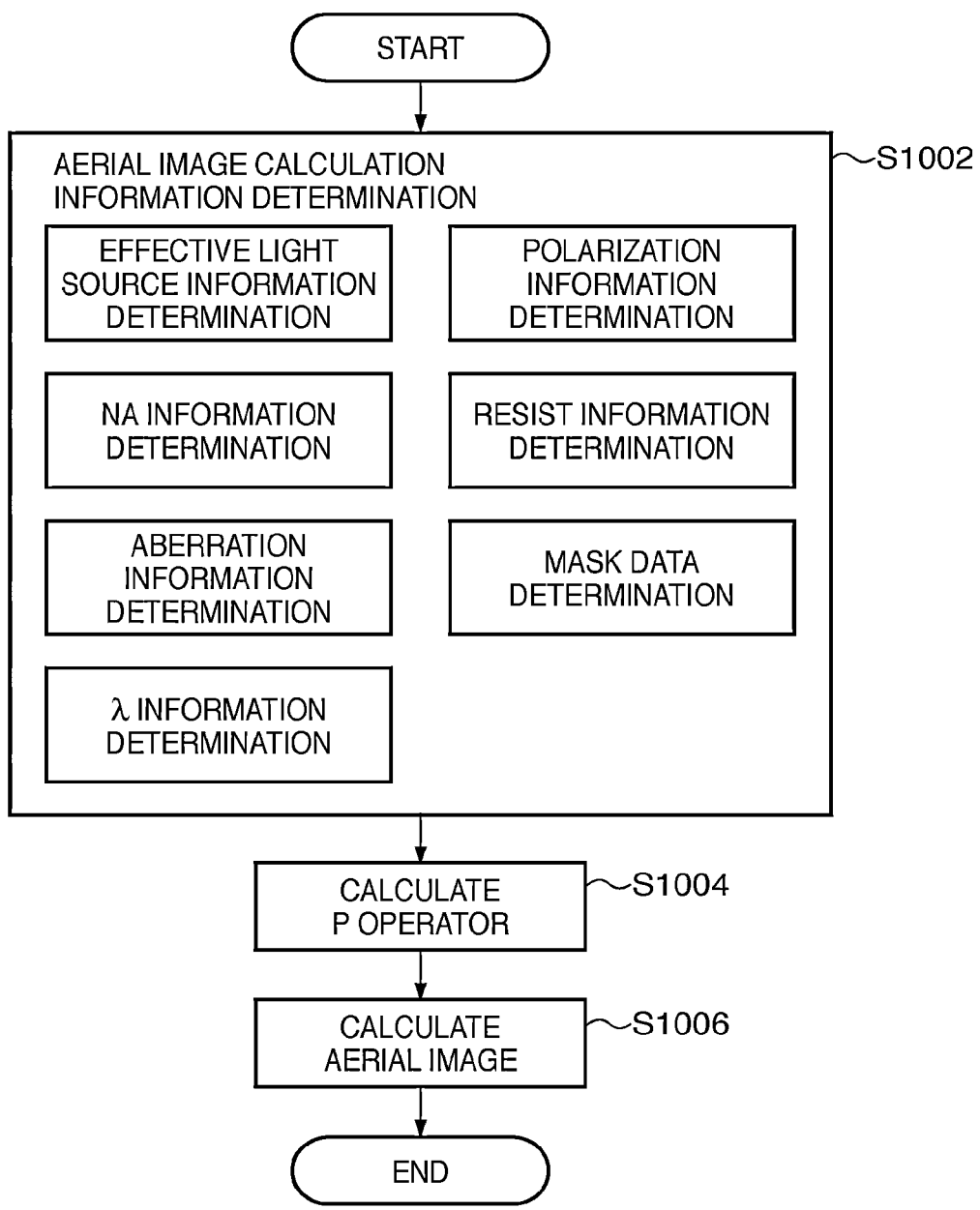

F I G. 8A
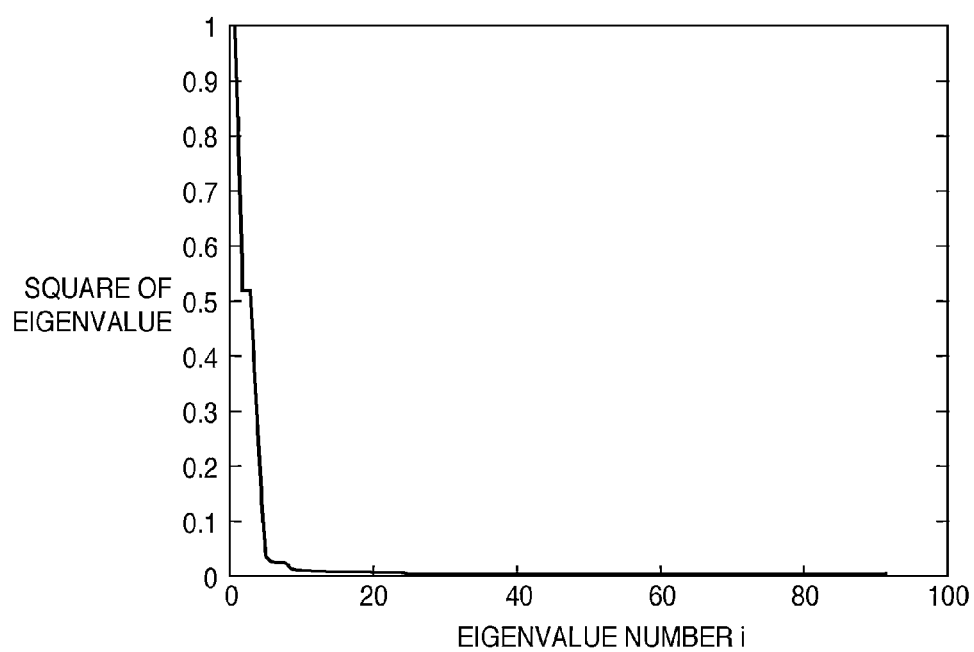

F I G. 14A
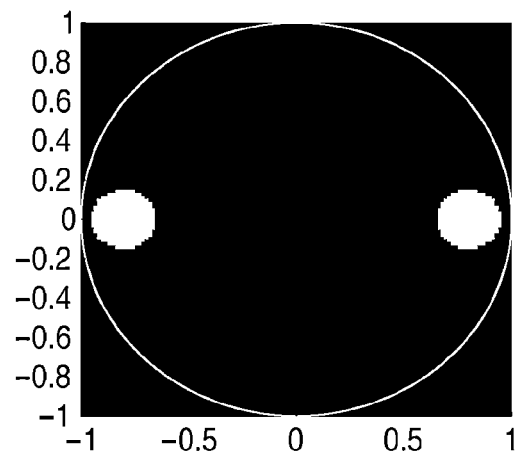
F I G. 14B
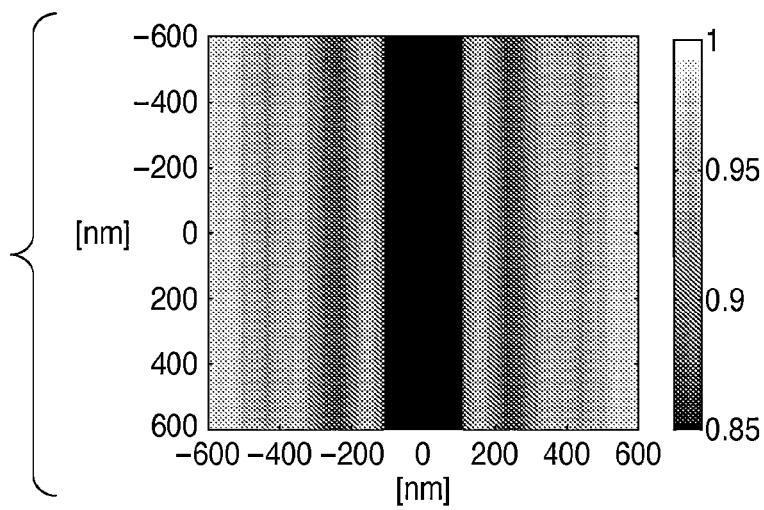
F I G. 14C
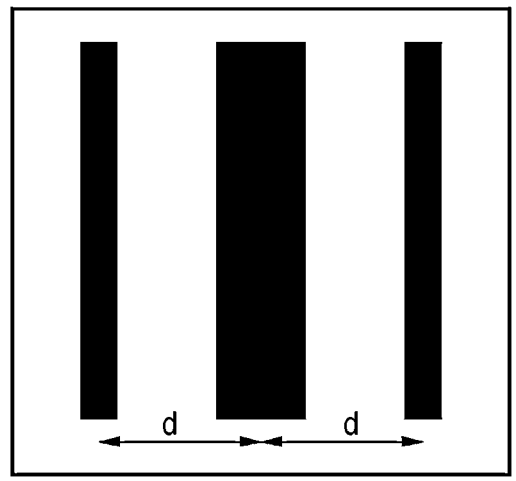

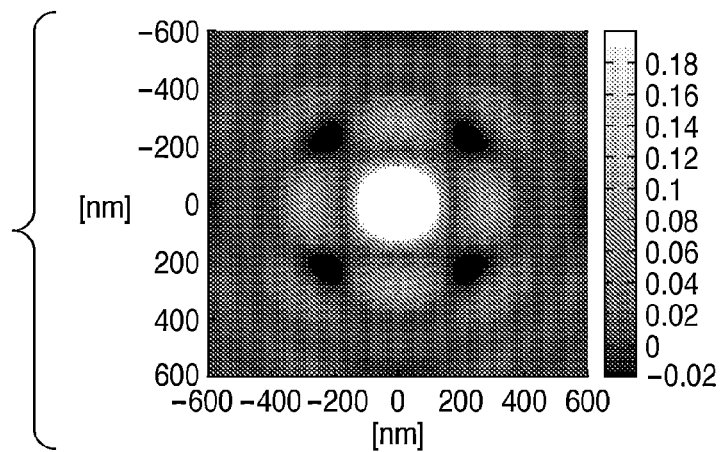
F I G. 15A
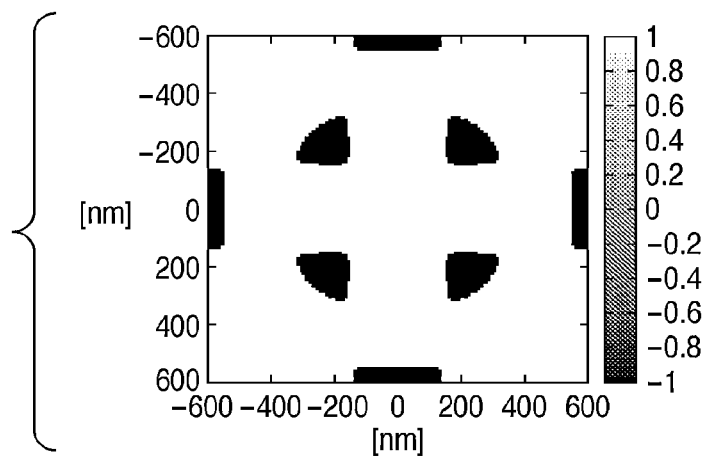
F I G. 15B
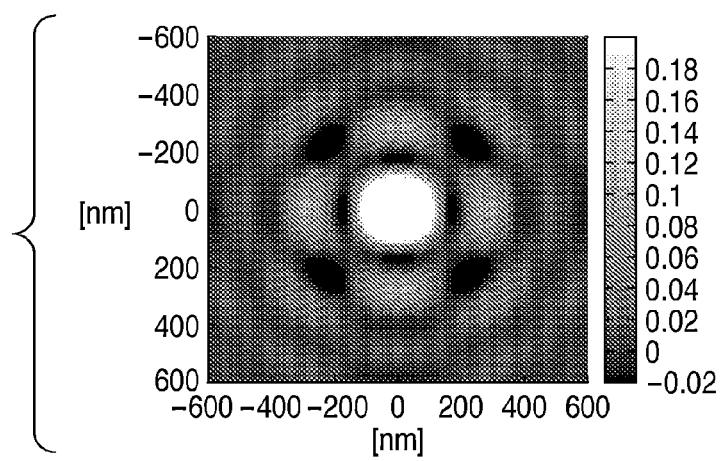
F I G. 15C

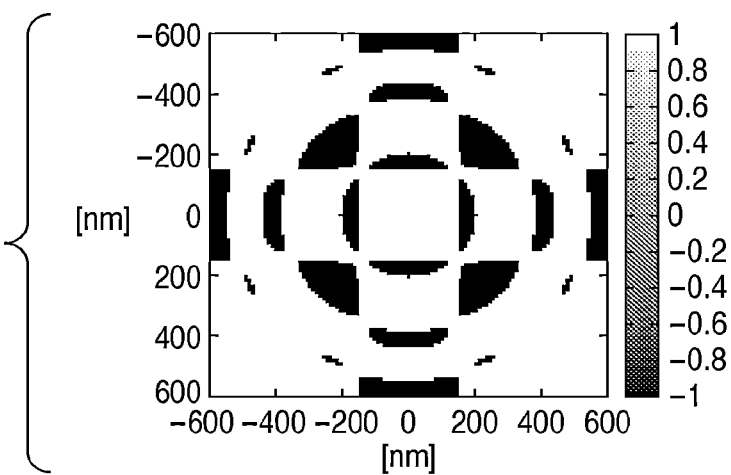
F I G. 15D
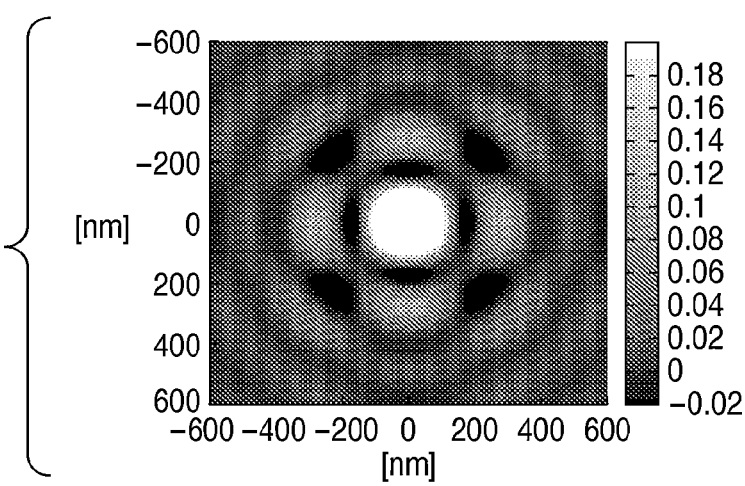
F I G. 15E
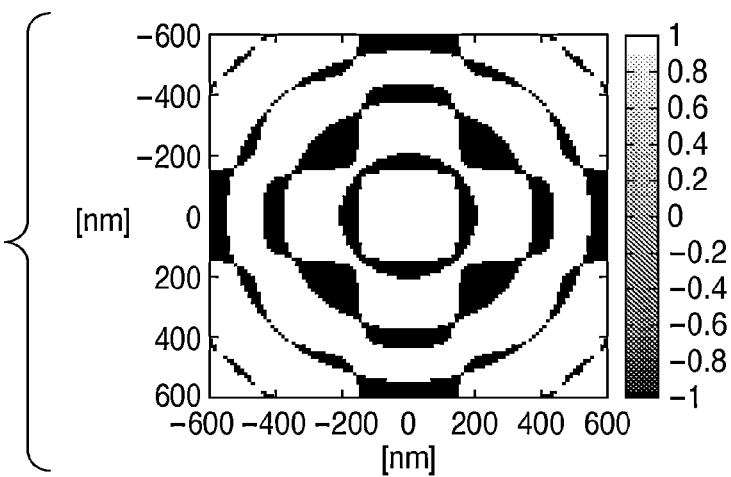
F I G. 15F

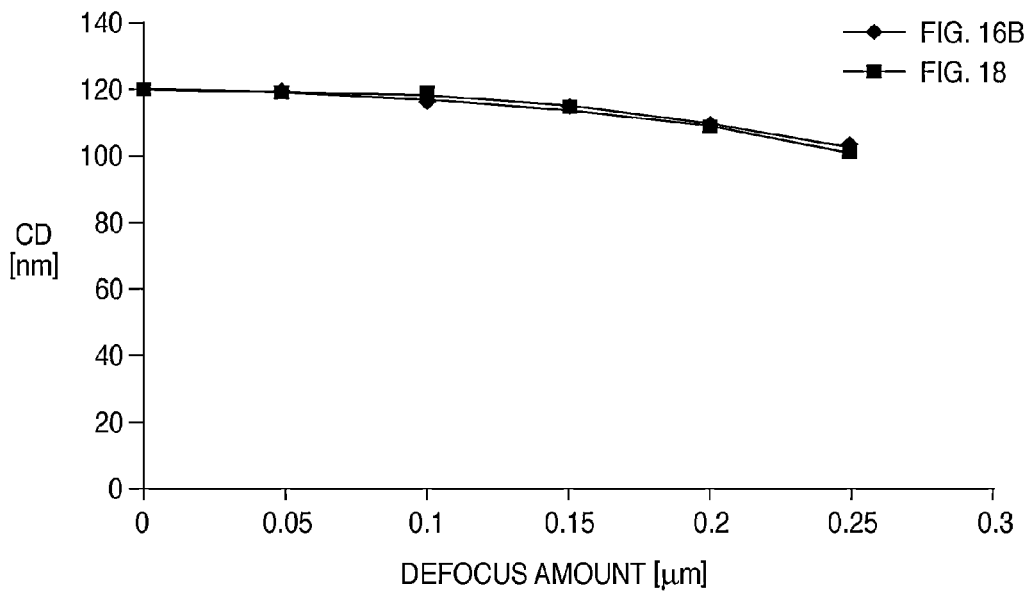
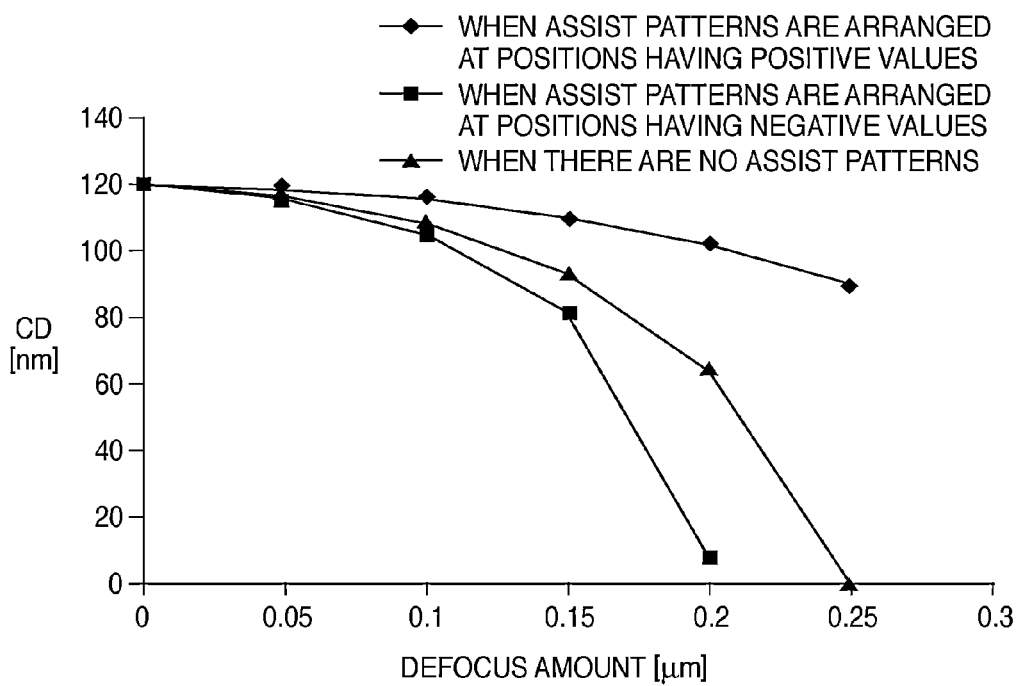

CALCULATION METHOD, GENERATION METHOD, PROGRAM, EXPOSURE METHOD, AND MASK FABRICATION METHOD

CROSS REFERENCE TO RELATED APPLICATIONS

This application is a Divisional application pursuant to 37 CFR § 1.53(b) of U.S. patent application Ser. No. 13/248,480 filed Sep. 29, 2011, which is a divisional of prior U.S. application Ser. No. 12/241,702 filed Sep. 30, 2008, now U.S. Pat. No. 8,059,262, which claims foreign priority benefit from Japanese Patent Application No. 2007-260360 filed on Oct. 3, 2007. The disclosures of the above-named applications are hereby incorporated by reference herein in their entirety.

BACKGROUND OF THE INVENTION

Field of the Invention

The present invention relates to a calculation method, a generation method, a program, an exposure method, and a mask fabrication method.

Description of the Related Art

A projection exposure apparatus which projects and transfers a circuit pattern formed on a mask (or reticle) onto a substrate such as a wafer by a projection optical system is employed to fabricate a semiconductor device by using photolithography. Along with the recent advance in the micropatterning of semiconductor devices, the projection exposure apparatus is being desired to further improve the resolving power (attain a higher resolution).

As a means for achieving a higher resolution of the projection exposure apparatus, it is a common practice to attain a higher NA of the projection optical system (increasing the numerical aperture (NA) of the projection optical system), and to shorten the exposure light. Also, the RET (Resolution Enhanced Technology) which improves the resolution of the projection exposure apparatus by decreasing the k1 factor (also called the "process constant") is attracting a great deal of attention.

The smaller the k1 factor, the higher the degree of difficulty of exposure. Conventionally, exposure conditions under which a circuit pattern can be projected faithfully have been detected by repeating experiments several times. That is, exposure (e.g., the exposure conditions and exposure method) has been optimized in this way. At present, however, as the degree of difficulty of exposure is increasing, the detection of the exposure conditions based on experiments requires a long time and high cost. Nowadays, to solve this problem, it is becoming mainstream to optimize, for example, the exposure conditions by repeating exposure simulation using a computer. The mainstream of the simulation technique is the so-called model-based RET which executes simulation based on a physical model of optics.

The model-based RET generally uses partial coherent imaging calculation. Improving the speed of the partial coherent imaging calculation makes it possible to shorten the time taken for the model-based RET. Nowadays, along with the progress in computer environment, the calculation speed is improved by forming a parallel processing system using a plurality of computers. There has also been proposed a technique of improving the calculation speed more effectively than in the formation of a parallel processing system using computers by improving an algorithm which executes the partial coherent imaging calculation.

For example, Cris Spence, "Full-Chip Lithography Simulation and Design Analysis—How OPC is Changing IC Design", Proceedings of SPIE, U.S.A., SPIE press, 2005, Vol. 5751, pp. 1-14 reports that an algorithm called the SOCS increased the calculation speed (simulation speed) to 10,000 times that before. Also, Alfred Kwok-kit Wong, "Optical Imaging in Projection Microlithography", U.S.A., SPIE press, 2005, pp. 151-163 describes the partial coherent imaging calculation, but does not introduce an algorithm which attains a calculation speed more than that attained by using the SOCS algorithm. Note that Alfred Kwok-kit Wong, "Optical Imaging in Projection Microlithography", U.S.A., SPIE press, 2005, pp. 151-163 calls the SOCS coherent decomposition.

Unfortunately, the SOCS requires much time to calculate the TCC (Transmission Cross Coefficient) and decompose it into eigenvalues and eigenfunctions.

SUMMARY OF THE INVENTION

The present invention provides a calculation method which can calculate the TCC in an exposure apparatus in a short period of time. The present invention provides a calculation method which can calculate a light intensity distribution, which is formed on the image plane of a projection optical system, in a short period of time. The present invention provides a generation method which can generate data of a pattern of a mask in a short period of time.

According to the first aspect of the present invention, there is provided a calculation method of calculating, by a computer, a light intensity distribution formed on an image plane of a projection optical system upon illuminating a mask using an illumination optical system and projecting an image of a pattern of the mask onto a substrate via the projection optical system, comprising a division step of dividing an effective light source formed on a pupil plane of the projection optical system into a plurality of point sources, a generation step of shifting a pupil function describing a pupil of the projection optical system for each of the plurality of point sources in accordance with positions thereof, thereby generating a plurality of shifted pupil functions, a defining step of defining a matrix including the plurality of pupil functions generated in the generation step, a first calculation step of performing singular value decomposition of the matrix defined in the defining step, thereby calculating an eigenvalue and an eigenfunction, and a second calculation step of calculating the light intensity distribution formed on the image plane of the projection optical system, based on a distribution of the light diffracted by the pattern of the mask, and the eigenvalue and the eigenfunction calculated in the first calculation step.

According to the second aspect of the present invention, there is provided a generation method of generating, by a computer, data of a pattern of a mask used for an exposure apparatus including a projection optical system, comprising a division step of dividing an effective light source formed on a pupil plane of the projection optical system into a plurality of point sources, a generation step of shifting a pupil function describing a pupil of the projection optical system for each of the plurality of point sources in accordance with positions thereof, thereby generating a plurality of shifted pupil functions, a defining step of defining a matrix including the plurality of pupil functions generated in the generation step, a first calculation step of performing singular value decomposition of the matrix defined in the defining step, thereby calculating an eigenvalue and an eigenfunction, a second calculation step of calculating a map representing, when elements of a target pattern are inserted on an object plane of the projection optical system, an influence the elements inflict on each other, based on a distribution of the light diffracted by the target pattern, and the eigenvalue and the eigenfunction calculated in the first calculation step, and a data generation step of generating data of the pattern of the mask based on the map calculated in the second calculation step.

According to the third aspect of the present invention, there is provided a storage medium storing a program for making a computer execute a process of calculating a light intensity distribution formed on an image plane of a projection optical system upon illuminating a mask using an illumination optical system and projecting an image of a pattern of the mask onto a substrate via the projection optical system, the program making the computer execute a division step of dividing an effective light source formed on a pupil plane of the projection optical system into a plurality of point sources, a generation step of shifting a pupil function describing a pupil of the projection optical system for each of the plurality of point sources in accordance with positions thereof, thereby generating a plurality of shifted pupil functions, a defining step of defining a matrix including the plurality of pupil functions generated in the generation step, a first calculation step of performing singular value decomposition of the matrix defined in the defining step, thereby calculating an eigenvalue and an eigenfunction, and a second calculation step of calculating the light intensity distribution formed on the image plane of the projection optical system, based on a distribution of the light diffracted by the pattern of the mask, and the eigenvalue and the eigenfunction calculated in the first calculation step.

According to the fourth aspect of the present invention, there is provided a storage medium storing a program for making a computer execute a process of generating data of a pattern of a mask used for an exposure apparatus including a projection optical system, the program making the computer execute a division step of dividing an effective light source formed on a pupil plane of the projection optical system into a plurality of point sources, a generation step of shifting a pupil function describing a pupil of the projection optical system for each of the plurality of point sources in accordance with positions thereof, thereby generating a plurality of shifted pupil functions, a defining step of defining a matrix including the plurality of pupil functions generated in the generation step, a first calculation step of performing singular value decomposition of the matrix defined in the defining step, thereby calculating an eigenvalue and an eigenfunction, a second calculation step of calculating a map representing, when elements of a target pattern are inserted on an object plane of the projection optical system, an influence the elements inflict on each other, based on a distribution of the light diffracted by the target pattern, and the eigenvalue and the eigenfunction calculated in the first calculation step, and a data generation step of generating data of the pattern of the mask based the map calculated in the second calculation step.

According to the fifth aspect of the present invention, there is provided an exposure method comprising a calculation step of calculating a light intensity distribution formed on an image plane of a projection optical system upon illuminating a mask using an illumination optical system and projecting an image of a pattern of the mask onto a substrate via the projection optical system, an adjusting step of adjusting an exposure condition based on the light intensity distribution calculated in the calculation step, and an exposure step of projecting the image of the pattern of the mask onto the substrate after the adjusting step, the calculation step including a division step of dividing an effective light source formed on a pupil plane of the projection optical system into a plurality of point sources, a generation step of shifting a pupil function describing a pupil of the projection optical system for each of the plurality of point sources in accordance with positions thereof, thereby generating a plurality of shifted pupil functions, a defining step of defining a matrix including the plurality of pupil functions generated in the generation step, a first calculation step of performing singular value decomposition of the matrix defined in the defining step, thereby calculating an eigenvalue and an eigenfunction, and a second calculation step of calculating the light intensity distribution formed on the image plane of the projection optical system, based on a distribution of the light diffracted by the pattern of the mask, and the eigenvalue and the eigenfunction calculated in the first calculation step.

According to the sixth aspect of the present invention, there is provided a mask fabrication method comprising generating data of a pattern for a mask by the above generation method, and fabricating the mask using generated data.

According to the seventh aspect of the present invention, there is provided an exposure method comprising steps of fabricating a mask by the above mask fabrication method, illuminating the fabricated mask, and projecting an image of a pattern of the mask onto a substrate via a projection optical system.

According to the eighth aspect of the present invention, there is provided a calculation method of calculating, by a computer, a transmission cross coefficient in an exposure apparatus which illuminates a mask using an illumination optical system and projects an image of a pattern of the mask onto a substrate via a projection optical system, comprising a division step of dividing an effective light source formed on a pupil plane of the projection optical system into a plurality of point sources, a generation step of shifting a pupil function describing a pupil of the projection optical system for each of the plurality of point sources in accordance with positions thereof, thereby generating a plurality of shifted pupil functions, a defining step of defining a matrix including the plurality of pupil functions generated in the generation step, and a calculation step of calculating the transmission cross coefficient based on the matrix defined in the defining step.

Further features of the present invention will become apparent from the following description of exemplary embodiments with reference to the attached drawings.

BRIEF DESCRIPTION OF THE DRAWINGS

FIG. 3 is a flowchart for explaining details of a process of calculating an aerial image by an aerial image calculation program in the processing apparatus 1 shown in FIG. 1.

FIGS. 4A to 4D are charts for explaining the first embodiment according to the present invention, in which FIG. 4A shows an effective light source used in the first embodiment, FIG. 4B shows mask data used in the first embodiment, FIG.

4C shows an aerial image calculated by an aerial image calculation program, and FIG. 4D shows an aerial image calculated by the SOCS.

FIGS. 7A to 7C are charts for explaining the third embodiment according to the present invention, in which FIG. 7A shows mask data and FIGS. 7B and 7C show aerial images calculated by an aerial image calculation program using the mask data shown in FIG. 7A and that after the OPC.

FIGS. 8A and 8B are graphs for explaining the fourth embodiment according to the present invention, in which FIG. 8A shows the relationship between the number and square of the eigenvalue, and FIG. 8B shows the difference between a complete aerial image and an approximated aerial image (i.e., an aerial image calculated from some eigenvalues and eigenfunctions).

FIGS. 9A to 9C are charts for explaining the fourth embodiment according to the present invention, in which FIG. 9A shows an effective light source, FIG. 9B shows an uncompressed P operator, and FIG. 9C shows a compressed P operator.

FIGS. 11A to 11E are charts for explaining the fifth embodiment according to the present invention, in which FIG. 11A shows an effective light source, FIG. 11B shows pattern data, FIG. 11C shows a P map, FIG. 11D shows mask data, and FIG. 11E shows regions each of which exhibits a value equal to or more than a threshold on the P map.

FIGS. 13A and 13B are charts for explaining the sixth embodiment according to the present invention, in which FIG. 13A shows pattern data and FIG. 13B shows a P map.

FIGS. 14A to 14C are charts for explaining the seventh embodiment according to the present invention, in which FIG. 14A shows an effective light source, FIG. 14B shows a P map, and FIG. 14C shows a mask.

FIGS. 15A to 15F are charts for explaining the eighth embodiment according to the present invention, which show P maps.

FIGS. 16A and 16B are charts for explaining the ninth embodiment according to the present invention, in which FIG. 16A shows a P map and FIG. 16B shows mask data.

FIG. 19 is a graph showing the result of a comparison of the imaging performances of a mask based on the mask data shown in FIG. 16B (ninth embodiment), and that based on the mask data shown in FIG. 18 (tenth embodiment).

FIG. 20 is a graph for explaining the eleventh embodiment according to the present invention, which shows the defocus characteristic when assist patterns that are in phase with a desired pattern to be transferred by exposure are arranged at positions having positive values on a P map, and that when assist patterns that are in phase with the desired pattern are arranged at positions having negative values on the P map.

FIGS. 22A to 22E are charts for explaining the eleventh embodiment according to the present invention, in which FIG. 22A shows pattern data, FIGS. 22B and 22C show mask data, and FIGS. 22D and 22E show mask data in which assist patterns are inserted.

FIGS. 23A to 23D are charts for explaining the twelfth embodiment according to the present invention, in which FIG. 23A shows pattern data, FIG. 23B shows an effective light source, FIG. 23C shows a P map, and FIG. 23D shows mask data.

FIGS. 25A and 25B are charts for explaining the twelfth embodiment according to the present invention, in which FIG. 25A shows pattern data and FIG. 25B shows an effective light source.

DESCRIPTION OF THE EMBODIMENTS

Figure 1:
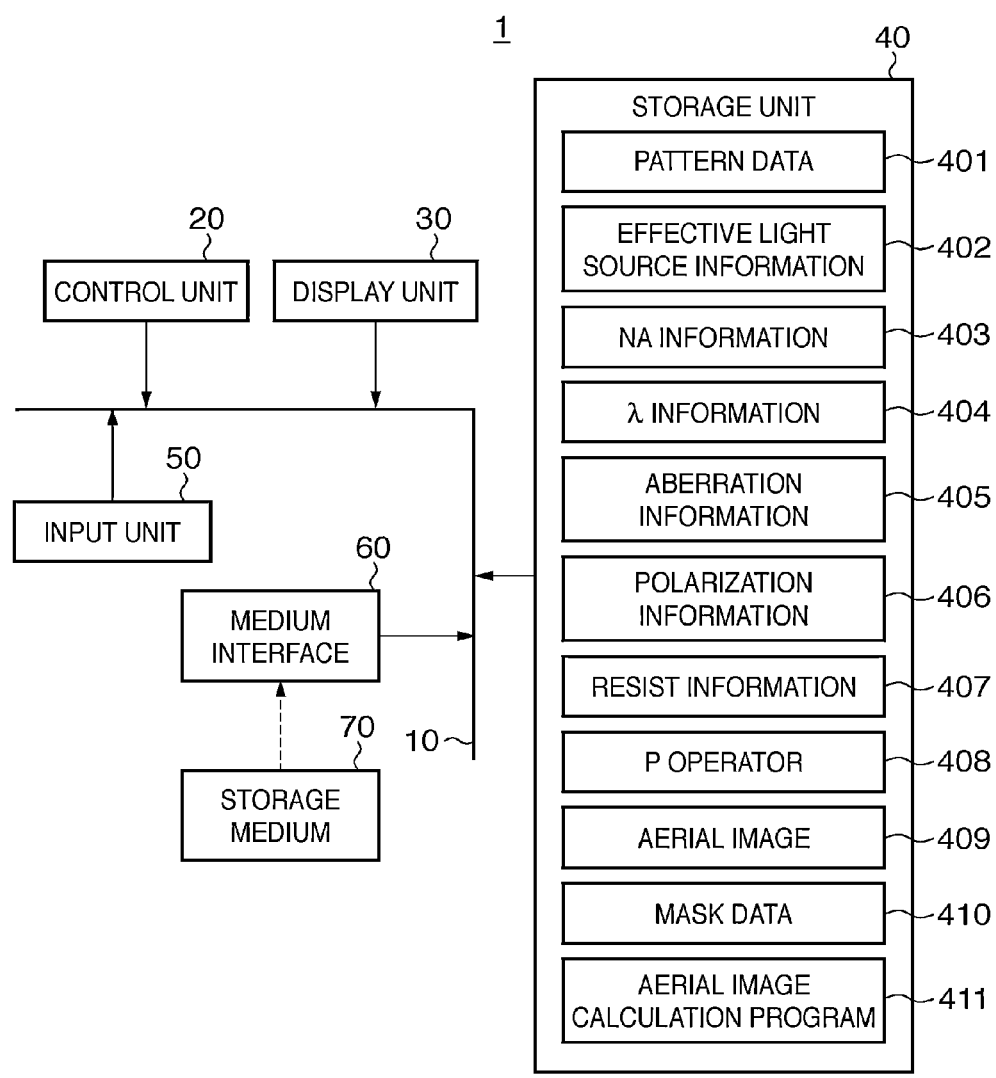
FIG. 1 is a schematic block diagram showing the configuration of a processing apparatus 1 which executes a calculation method according to one aspect of the present invention.

Preferred embodiments of the present invention will be described below with reference to the accompanying drawings. The same reference numerals denote the same members throughout the drawings, and a repetitive description thereof will not be given.

For example, the present invention is applicable to optical system imaging calculation based on partial coherent imaging (partial coherent imaging calculation) in, for example, an exposure apparatus and microscope. The present invention is also applicable to the generation of data of a mask used in micromechanics and in fabricating various devices, for example, semiconductor chips such as an IC and LSI, a display device such as a liquid crystal panel, a detection device such as a magnetic head, and an image sensing device such as a CCD. The micromechanics means herein a technique of fabricating a micrometer-order sophisticated machinery system by applying a semiconductor integrated circuit fabrication technique to the fabrication of a microstructure, or the machinery system itself.

The concept disclosed in the present invention can be modeled mathematically. Hence, the present invention can be implemented as a software function of a computer system. A software function of a computer system includes programming having executable software codes, and executes partial coherent imaging calculation in this embodiment. The software codes are executed by the processor of the computer system. Codes or associated data records are stored in the computer platform during the software code operation. However, the software codes are often stored in other sites or loaded into an appropriate computer system. The software codes can be held on at least one computer-readable recording medium as one or a plurality of modules. The contents of the present invention can be described in the form of codes described above, which can function as one or a plurality of software products.

Coordinate systems in an exposure apparatus according to this embodiment will be explained first. In this embodiment, the coordinate systems in an exposure apparatus are roughly classified into two.

The first coordinate system defines the coordinates on the mask surface (the object plane of the projection optical system) and the wafer surface (the image plane of the projection optical system), which are expressed by (x, y) in this embodiment. The pattern size on the mask surface is different from that on the wafer surface by the magnification of the projection optical system. For the sake of descriptive simplicity, the ratio between the pattern size on the mask surface and that on the wafer surface is set at 1:1 by multiplying the pattern size on the mask surface by the magnification of the projection optical system in the following description. With this setting, the ratio between the coordinate system on the mask surface and that on the wafer surface also becomes 1:1.

The second coordinate system defines the coordinates on the pupil plane of the projection optical system, which are expressed by (f, g) in this embodiment. The coordinates (f, g) on the pupil plane of the projection optical system are defined by a coordinate system normalized assuming that the pupil size of the projection optical system is 1.

In the exposure apparatus, a light intensity distribution formed on the pupil plane of the projection optical system while no mask is inserted on the object plane of the projection optical system is called an effective light source, which is expressed by S(f, g) in this embodiment. The pupil of the projection optical system is expressed by a pupil function P(f, g) in this embodiment. In general, the pupil function can include the influences (pieces of information) of aberration and polarization on the pupil property. Even the pupil function P(f, g) in this embodiment can include the influences of aberration and polarization on the pupil property.

The exposure apparatus illuminates a mask by partial coherent illumination and projects the pattern of the mask (mask pattern) onto a wafer. In this embodiment, a mask pattern including pieces of information on the transmittance and phase is defined by o(x, y), and a light intensity distribution (aerial image) formed on the wafer surface is defined by I(x, y). The amplitude of light diffracted by the mask pattern is defined by the pupil plane of the projection optical system, and expressed by a(f, g) in this embodiment.

The conventional partial coherent imaging calculation will be explained herein. The conventional partial coherent imaging calculation (the calculation of the light intensity distribution on the image plane of the projection optical system) can be roughly classified into three types.

The first calculation method is the so-called Abbe method. More specifically, the Abbe method calculates the light intensity distribution I(x, y) by:

$$I(x, y) = \sum_{i=1}^{N_1} S(f_i', g_i')|F[P(f, g)a(f - f_i', g - g_i')]|^2 \quad (1)$$

where $N_1$ is the number of point sources for numerical calculation, and F is the Fourier transform.

The second calculation method calculates the TCC without eigenvalue decomposition. The TCC is defined by:

$$TCC(f', g', f'', g'') = \iint S(f, g)P(f+f', g+g')P^*(f+f'', g+g'')dfdg \quad (2)$$

Referring to equation (2), the TCC is given by a four-dimensional function. Using the TCC, the light intensity distribution I(x, y) can be calculated by:

$$I(x, y) = \sum_{i,j,k,l=1}^{N_2} TCC(f_i', g_j', f_k'', g_l'')a(f_i', g_j') \\ a^*(f_k'', g_l'') \times \exp\{-i2\pi[(f_i' - f_k'')x + (g_j' - g_l'')y]\} \quad (3)$$

where $N_2$ is a number that i, j, k, and l can take, and depends on the pupil division number for numerical calculation.

The third calculation method is the so-called SOCS, which decomposes the TCC expressed by equation (2) into a plurality of eigenvalues and eigenfunctions. The light intensity distribution I(x, y) is calculated by:

$$I(x, y) = \sum_{i=1}^{N_3} \lambda_i |F[\psi_i(f, g)a(f, g)]|^2 \quad (4)$$

where $\lambda_i$ is the i-th eigenvalue, $\psi_i$ is the i-th eigenfunction, and $N_3$ is the number of point sources for numerical calculation.

The Abbe method is suitable for small-scale calculation (small-scale simulation). More specifically, the Abbe method is suitable for simulation associated with part of a mask, and for checking changes in imaging performance when optical settings (e.g., the effective light source, aberration, and polarization) are changed.

The calculation speed in the calculation method using the TCC, that is, the calculation method using equation (3) is lower than those in the Abbe method and SOCS because quadrupole integration must be performed in equation (3). To calculate the light intensity distribution without the quadrupole integration in equation (3), the SOCS is available. The SOCS is suitable for large-scale calculation (large-scale simulation).

In large-scale calculation, the partial coherent imaging calculation is performed by dividing a mask into a plurality of regions. If optical settings do not change, the TCC expressed by equation (2) does not change and the eigenfunction $\psi_i$ in equation (4), in turn, does not change either. Once the eigenvalue $\lambda_i$ and eigenfunction $\psi_i$ are calculated, simple calculation need only be repeated thereafter, so the SOCS is suitable for large-scale calculation. However, the SOCS is unsuitable for small-scale calculation.

As can be understood from equation (2), since double integration is necessary to calculate the TCC (i.e., the TCC is given by a four-dimensional function), the SOCS requires much time to calculate the TCC and a huge capacity of computer memory. The SOCS also requires much time to calculate the eigenvalue $\lambda_i$ and eigenfunction $\psi_i$. Furthermore, if optical settings change, the TCC must be calculated again in the SOCS. From these viewpoints, the SOCS is unsuitable for checking changes in imaging performance by changing the optical settings.

As described above, the conventional calculation methods require huge amounts of time for simulation. In addition, the Abbe method and SOCS must be selectively used in accordance with the calculation target (i.e., whether small-scale calculation or large-scale calculation is executed) in the prior art.

FIG. 1 is a schematic block diagram showing the configuration of a processing apparatus 1 which executes a calculation method according to one aspect of the present invention.

The processing apparatus 1 is formed from, for example, a general-purpose computer and includes a bus line 10, control unit 20, display unit 30, storage unit 40, input unit 50, and medium interface 60, as shown in FIG. 1.

The bus line 10 interconnects the control unit 20, display unit 30, storage unit 40, input unit 50, and medium interface 60.

The control unit 20 is formed from a CPU, GPU, DSP, or microcomputer, and includes a cash memory for temporal storage.

The display unit 30 is formed from, for example, a display device such as a CRT display or liquid crystal display.

The storage unit 40 is formed from, for example, a memory or hard disk. In this embodiment, the storage unit 40 stores pattern data 401, effective light source information 402, NA information 403, λ information 404, aberration information 405, polarization information 406, and resist information 407. The storage unit 40 also stores a P operator 408, an aerial image 409, mask data 410, and an aerial image calculation program 411.

The pattern data 401 is data of a pattern (layout pattern or target pattern) laid out in designing, for example, an integrated circuit.

The effective light source information 402 is associated with a light intensity distribution (effective light source) formed on the pupil plane of the projection optical system of the exposure apparatus.

The NA information 403 is associated with the numerical aperture, on the image side, of the projection optical system of the exposure apparatus.

The λ information 404 is associated with the wavelength of light (exposure light) emitted by the light source of the exposure apparatus.

The aberration information 405 is associated with the aberration of the projection optical system of the exposure apparatus.

The polarization information 406 is associated with the polarization of light formed by the illumination apparatus (illumination optical system) of the exposure apparatus (the polarization state of the illumination light).

The resist information 407 is associated with a resist applied on the wafer.

The P operator 408 is a matrix necessary in the process of calculating an aerial image as a light intensity distribution formed on the wafer surface (i.e., for the aerial image calculation program 411), as will be described in detail later.

The aerial image 409 is the result of calculating the aerial image (light intensity distribution) by the aerial image calculation program 411.

The mask data 410 is data of an actual mask (reticle). The mask data 410 is generally different from the pattern data 401.

The aerial image calculation program 411 is a program for calculating the aerial image (light intensity distribution).

The input unit 50 includes, for example, a keyboard and mouse.

The medium interface 60 includes, for example, a floppy disk drive, CD-ROM drive, and USB interface, and can be connected to a storage medium 70. The storage medium 70 includes, for example, a floppy disk, CD-ROM, and USB memory.

How to calculate the aerial image 409 by the aerial image calculation program 411 will be explained below by paying attention particularly to the P operator 408. Note that in this embodiment, the wavelength of the exposure light is indicated by λ, and the numerical aperture, on the image side, of the projection optical system is indicated by NA. Note also that the ratio between the numerical aperture of illumination light which is guided from the illumination optical system to the mask surface and that of the projection optical system on its object side is indicated by σ.

The mask pattern and the aerial image in the exposure apparatus have a partial coherent imaging relationship. The partial coherent imaging calculation is roughly classified into three types (see equations (1), (3), and (4)), as described above. Since the Fourier transforms F are used in equations (1) and (4), the sum of plane waves forms an aerial image from the viewpoint of Fourier optics. Each plane wave is expressed by $\exp[-i2\pi(fx+gy)]$. Although equation (3) does not clearly exhibit the Fourier transform F, the sum of plane waves similarly forms an aerial image because $\exp[-i2\pi(fx+gy)]$ is included in it.

In this manner, the partial coherent imaging is based on the plane wave $\exp[-i2\pi(fx+gy)]$ from the viewpoint of optics. On the other hand, $\exp[-i2\pi(fx+gy)]$ is defined by an orthogonal function system from the viewpoint of mathematics. In this embodiment, the plane wave is defined by an orthogonal function system, thereby attaining the calculation of the aerial image 409 in a shorter period of time.

A case in which a one-dimensional aerial image (light intensity distribution) is calculated will be exemplified first. In this case, the plane wave can be expressed by $\exp(-i2\pi fx)$. The orthogonal function system is defined by a vector:

$$|\phi\rangle = \begin{pmatrix} e^{-i2\pi f_1 x} \\ e^{-i2\pi f_2 x} \\ \vdots \\ e^{-i2\pi f_M x} \end{pmatrix} \tag{5}$$

where M is the division number of f when $-2 \leq f \leq 2$.

Figure 2:
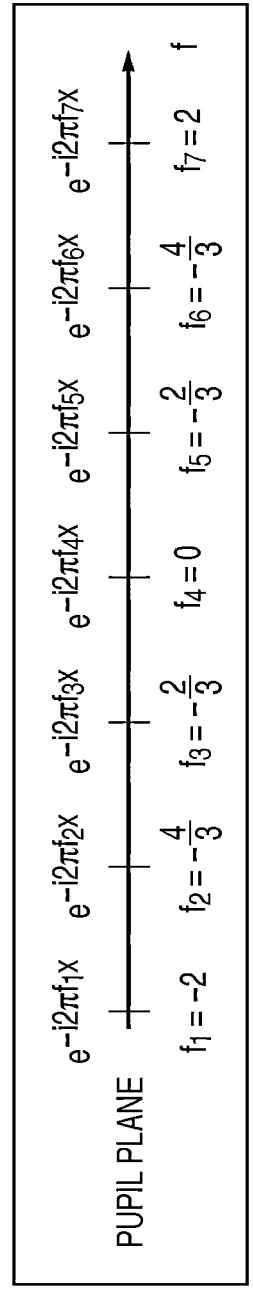
FIG. 2 is a chart schematically showing one-dimensional plane waves (orthogonal function system).

The P operator 408 will be explained herein. Since M in equation (5) is assumed as 7 in this embodiment, $f_1=-2$, $f_2=-4/3$, $f_3=-2/3$, $f_4=0$, $f_5=2/3$, $f_6=4/3$, and $f_7=2$, as shown in FIG. 2. FIG. 2 is a chart schematically showing one-dimensional plane waves (orthogonal function system).

The distribution of light diffracted by the mask pattern (diffracted light distribution) can be expressed by $a(f_i)\exp(-i2\pi f_i x)$. Then, a vector $|\phi'\rangle$ of the diffracted light distribution can be expressed by:

$$|\phi'\rangle = \begin{pmatrix} a(f_1) & 0 & \cdots & 0 \\ 0 & a(f_2) & & 0 \\ \vdots & & \ddots & 0 \\ 0 & 0 & \cdots & a(f_7) \end{pmatrix} \begin{pmatrix} e^{-2\pi f_1 x} \\ e^{-2\pi f_2 x} \\ \vdots \\ e^{-2\pi f_7 x} \end{pmatrix} \tag{6}$$

$$= A|\phi\rangle$$

where A is a diagonal matrix having the amplitude $a(f_i)$ of the diffracted light as the diagonal element.

When the projection optical system has no aberration, its pupil has a function of passing a diffracted light component in the range of $-1 \leq f \leq 1$ intact, and shielding that in the range of $|f|>1$. Outputting light from one point f' on the effective light source amounts to shifting the pupil of the projection optical system by f'. Hence, when light emanating from one point f' on the effective light source is diffracted by the mask pattern, a diffracted light component in the range of $-1 \leq f-f' \leq 1$ passes through the pupil of the projection optical system, while that in the range of $|f-f'|>1$ is shielded by the pupil of the projection optical system.

For example, if light emanating from $f=f_4=0$ on the effective light source is diffracted by the mask pattern and stopped down by the pupil of the projection optical system, an amplitude $|\phi_1\rangle$ of the diffracted light transmitted through the pupil of the projection optical system can be expressed by:

$$|\phi_1\rangle = (0011100)A|\phi\rangle \tag{7}$$

Calculating the square of the absolute value of the amplitude of the diffracted light transmitted through the pupil of the projection optical system yields the light intensity on the wafer surface. Hence, a light intensity distribution $I_1(x)$ formed on the wafer surface by the point source at $f=f_4=0$ can be expressed by:

$$I_1(x) = \langle \phi_1 | \phi_1 \rangle \tag{8}$$

where $\langle \phi_1 |$ is the transposed conjugate (adjoint) matrix of $|\phi_1\rangle$.

Likewise, if light emanating from $f=f_3$ on the effective light source is diffracted by the mask pattern and stopped down by the pupil of the projection optical system, an amplitude $|\phi_2\rangle$ of the diffracted light transmitted through the pupil of the projection optical system can be expressed by:

$$|\phi_2\rangle = (0001110)A|\phi\rangle \tag{9}$$

Hence, a light intensity distribution $I_2(x)$ formed on the wafer surface by the point source at $f=f_3$ can be expressed by:

$$I_2(x) = \langle \phi_2 | \phi_2 \rangle \tag{10}$$

Also, the partial coherent illumination can be considered to be a set of incoherent point sources. For example, assume that two point sources exist on the effective light source, and the coordinates of these point sources are $f=0$ and $f=f_3$. Since the two point sources are incoherent, a light intensity distribution $I(x)$ formed on the wafer surface by these two point sources can be expressed by $I_1(x)+I_2(x)$ (i.e., the sum of the light intensities on the wafer surface).

A P operator $P_{1D}$ is defined by:

$$P_{1D} = \begin{pmatrix} 0011100 \\ 0001110 \end{pmatrix} \tag{11}$$

Referring to equation (11), each row of the P operator $P_{1D}$ is a vector in which the pupil of the projection optical system is shifted in accordance with the position of each point source on the effective light source. More specifically, the pupil of the projection optical system need only be shifted by the difference between the central position on the pupil plane of the projection optical system and the position of each point source. Using the P operator $P_{1D}$, a light intensity distribution $I(x)$ formed on the wafer surface can be expressed by:

$$I(x) = \langle \phi' | P_{1D}{}^+ P_{1D} | \phi' \rangle \tag{12}$$

Note that the "+" sign represents the transposed conjugate matrix of a certain matrix. Referring to equation (12), the light intensity distribution $I(x)$ is $I_1(x)+I_2(x)$. In other words, the use of the P operator $P_{1D}$ allows to simply express an aerial image as a light intensity distribution formed on the wafer surface.

Equation (12) can be rewritten as:

$$I(x) = \langle \phi' | T_{1D} | \phi' \rangle \tag{13}$$

$T_{1D}$ is a matrix defined by:

$$T_{1D} = P_{1D}{}^+ P_{1D} \tag{14}$$

The matrix $T_{1D}$ defined by equation (14) describes the TCC. To calculate $P_{1D}$, the pupil of the projection optical system need only be shifted and multiplication and addition are not needed. This makes it possible to calculate $P_{1D}$ in a shorter period of time. Still better, since the TCC can be calculated by the multiplication of $P_{1D}$ and its transposed conjugate, the use of the P operator 408 allows to calculate the TCC more quickly than in the use of equation (2).

Note that $P_{1D}$ is not a square matrix. Using the singular value decomposition, $P_{1D}$ is rewritten as:

$$P_{1D} = WSV \tag{15}$$

where S is a diagonal matrix, and W and V are unitary matrices. Substituting equation (15) into equation (12), and solving it using the theorem of the singular value decomposition that $W^+W$ is a unit matrix yields:

$$\begin{aligned} I(x) &= \langle \phi' | P_{1D}^+ P_{1D} | \phi' \rangle \\ &= \langle \phi' | V^+ S^+ W^+ W S V | \phi' \rangle \\ &= \langle \phi' | V^+ S S V | \phi' \rangle \\ &= S^2 \langle \phi' | V^+ V | \phi' \rangle \\ &= S^2 \langle \Phi | \Phi \rangle \end{aligned} \tag{16}$$

The SOCS as one conventional partial coherent imaging calculation method decomposes the TCC into eigenvalues and eigenfunctions, as described above. Since the TCC is a very large matrix, a huge amount of time and a huge capacity of computer memory are required to calculate the TCC. Furthermore, a huge amount of time is also required to decompose the TCC into eigenvalues and eigenfunctions.

In this embodiment, the singular value decomposition is performed for the P operator 408. Referring to equation (14), since the elements of the P operator 408 are obviously fewer than those of the TCC, the singular value decomposition of the P operator 408 requires less time than in the TCC. Moreover, since multiplication and addition are not needed to calculate the P operator 408, it is possible to calculate the P operator 408 in a shorter period of time. In other words, the use of the P operator 408 allows to calculate eigenvalues and eigenfunctions with a smaller amount of calculation and a smaller memory capacity than in the SOCS. This makes it possible to calculate the aerial image 409 as a light intensity distribution, which is formed on the wafer surface, in a shorter period of time. Also, the use of equation (14) allows calculating the TCC in a shorter period of time.

A case in which a one-dimensional aerial image (light intensity distribution) is calculated has been exemplified above, and a case in which a two-dimensional aerial image (light intensity distribution) is calculated will be exemplified below.

Let $(f_i, g_j)$ be the coordinates on the pupil plane of the discretized projection optical system. Note that i and j range from 1 to M. A vector $|\phi'_{2D}\rangle$ of the diffracted light distribution is expressed by a one-dimensional array of elements:

$$|\phi'_{2D}\rangle = \begin{pmatrix} a(f_1, g_1)e^{-i2\pi(f_1x+g_1y)} \\ a(f_2, g_1)e^{-i2\pi(f_2x+g_1y)} \\ \vdots \\ a(f_m, g_1)e^{-i2\pi(f_Mx+g_1y)} \\ a(f_1, g_2)e^{-i2\pi(f_1x+g_2y)} \\ \vdots \\ a(f_M, g_M)e^{-i2\pi(f_Mx+g_My)} \end{pmatrix} \quad (17)$$

For the sake of a detailed expression of $|\phi'_{2D}\rangle$, "floor" represents the omission of fractions after the decimal point. The n-th row of $|\phi'_{2D}\rangle$ is $a(f_i, g_j)\exp[-i2\pi(f_ix+g_jy)]$ assuming $j=\text{floor}[(n-1)\div M]+1$ and $i=n-(j-1)\times M$. A two-dimensional orthogonal function system is obtained in this way.

Letting $(f_1, g_1)$ be the coordinates of the first point source on the effective light source, outputting light from the first point source amounts to shifting the pupil function $P(f, g)$ describing the pupil of the projection optical system by $(f_1, g_1)$. A pupil function $P_1(f, g)$ that acts on the diffracted light is expressed by $P(f+f_1, g+g_1)$. The elements of the pupil function $P_1(f, g)$ are arrayed one-dimensionally, as indicated by equation (17). Hence, the pupil function $P_1(f\ g)$ can be expressed by a one-dimensional vector:

$$P_1=(P_1(f_1,g_1)P_1(f_2,g_1)\ldots P_1(f_M,g_1)P_1(f_1,g_2)\ldots P_1(f_M,g_M)) \quad (18)$$

For the sake of a detailed expression of $P_1$, "floor" represents the omission of fractions after the decimal point. The n-th column of $P_1$ is $P_1(f_i, g_j)$ assuming $j=\text{floor}[(n-1)\div M]+1$ and $i=n-(j-1)\times M$. A two-dimensional orthogonal function system is obtained in this way.

Letting $(f_2, g_2)$ be the coordinates of the second point source on the effective light source, a pupil function $P_2(f, g)$ that acts on the light emanating from the second point source is expressed by $P(f+f_2, g+g_2)$ obtained by shifting $P(f, g)$ by $(f_2, g_2)$. Like the pupil function $P_1(f, g)$, the pupil function $P_2(f, g)$ can be expressed as a one-dimensional vector:

$$P_2=(P_2(f_1,g_1)P_2(f_2,g_1)\ldots P_2(f_1,g_1)P_2(f_1,g_2)\ldots P_2(f_M,g_M)) \quad (19)$$

If N point sources exist on the effective light source, a two-dimensional P operator 408 can be defined by:

$$P_{2D} = \begin{pmatrix} P_1 \\ P_2 \\ \vdots \\ P_N \end{pmatrix} \quad (20)$$

Using $|\phi'_{2D}\rangle$ and $P_{2D}$, a two-dimensional light intensity distribution $I(x, y)$ formed on the wafer surface can be calculated by:

$$I(x,y)=\langle\phi'_{2D}|P_{2D}^+P_{2D}|\phi'_{2D}\rangle \quad (21)$$

In equation (21), the singular value decomposition of $P_{2D}$ yields:

$$\begin{aligned} I(x, y) &= \langle\phi'_{2D}|P_{2D}^+P_{2D}|\phi'_{2D}\rangle \\ &= \langle\phi'_{2D}|V^+S^+W^+WSV|\phi'_{2D}\rangle \\ &= \langle\phi'_{2D}|V^+SSV|\phi'_{2D}\rangle \\ &= S^2\langle\phi'_{2D}|V^+V|\phi'_{2D}\rangle \\ &= S^2\langle\Phi_{2D}|\Phi_{2D}\rangle \end{aligned} \quad (22)$$

In this manner, even when a two-dimensional aerial image (light intensity distribution) is calculated, the elements of the P operator 408 are fewer than those of the TCC, and complicated calculation of the P operator 408 is unnecessary. This makes it possible to calculate the aerial image 409 as a light intensity distribution, which is formed on the wafer surface, in a shorter period of time.

A two-dimensional set of light components diffracted by the mask pattern can be expressed by:

$$\psi_{2D} = \begin{pmatrix} a(f_1, g_1)e^{-i2\pi(f_1x+g_1y)} & a(f_2, g_1)e^{-i2\pi(f_2x+g_1y)} & \ldots & a(f_M, g_1)e^{-i2\pi(f_Mx+g_1y)} \\ a(f_1, g_1)e^{-i2\pi(f_1x+g_2y)} & \ddots & & \vdots \\ \vdots & & & \\ a(f_1, g_M)e^{-i2\pi(f_1x+g_My)} & \ldots & & a(f_M, g_M)e^{-i2\pi(f_Mx+g_My)} \end{pmatrix} \quad (23)$$

Referring to equation (23), $\psi_{2D}$ is a matrix of M rows×M columns, which includes $M^2$ elements. An operator (stacking operator) Y which transforms the matrix of M rows×M columns into that of 1 row×$M^2$ columns (i.e., rearranges the elements of $\psi_{2D}$) in accordance with a predetermined rule is introduced herein. By introducing the stacking operator Y, a vector $|\phi'_{2D}\rangle$ of a two-dimensional diffracted light distribution is expressed by:

$$|\phi'_{2D}\rangle = Y[\psi_{2D}]^T \quad (24)$$

Letting $(f_1, g_1)$ be the coordinates of the first point source on the effective light source, outputting light from the first point source amounts to shifting the pupil of the projection optical system. A pupil function $P_1(f, g)$ that acts on the diffracted light is expressed by $P(f+f_1, g+g_1)$. Hence, the pupil function $P_1(f, g)$ can be expressed by:

$$P'_1 = \begin{pmatrix} P_1(f_1, g_1) & P_1(f_2, g_1) & \ldots & P_1(f_M, g_1) \\ P_1(f_1, g_2) & \ddots & & \vdots \\ P_1(f_1, g_M) & \ldots & & P_1(f_M, g_M) \end{pmatrix} \quad (25)$$

Likewise, letting $(f_2, g_2)$ be the coordinates of the second light source on the effective light source, a pupil function $P_2(f, g)$ that acts on the light emanating from the second point source is expressed by $P(f+f_2, g+g_2)$. Like the pupil function $P_1(f, g)$, the pupil function $P_2(f, g)$ can be expressed by:

$$P'_2 = \begin{pmatrix} P_2(f_1, g_1) & P_2(f_2, g_1) & \cdots & P_2(f_M, g_1) \\ P_2(f_1, g_2) & \ddots & & \vdots \\ \vdots & & & \\ P_2(f_1, g_M) & \cdots & & P_2(f_M, g_M) \end{pmatrix} \quad (26)$$

Assume that N point sources exist on the effective light source. Using the stacking operator Y, a two-dimensional P operator 408 can be expressed by:

$$P_{2D} = \begin{pmatrix} Y[P'_1] \\ Y[P'_2] \\ \vdots \\ Y[P'_N] \end{pmatrix} \quad (27)$$

When an aerial image as a light intensity distribution formed on the wafer surface is calculated from equations (24) and (27), equation (21) or (22) need only be used.

When the TCC is calculated, $$T_{2D} = P_{2D}{}^+ P_{2D} \quad (28)$$

need only be used.

The P operators 408 according to which the pupil of the projection optical system is shifted so as to form point sources in the row direction have been explained above, as indicated by equations (20) and (27). However, a P operator 408 according to which the pupil of the projection optical system is shifted so as to form point sources in the column direction as indicated by:

$$P_2D = (Y[P'_1]^T Y[P'_2]^T \ldots Y[P'_N]^T) \quad (29)$$

can produce essentially the same effect. Hence, even when the P operator 408 is expressed by equation (29), a description of an orthogonal function system need only be so adjusted.

FIG. 3 is a flowchart for explaining details of a process of calculating the aerial image 409 by the aerial image calculation program 411. Note that the aerial image calculation program 411 is installed from the storage medium 70 connected to the medium interface 60, and is stored in the storage unit 40 via the control unit 20. Also, the aerial image calculation program 411 is started up in response to a start-up command input from the input unit 50 by the user, and is executed by the control unit 20.

In step S1002, the control unit 20 determines pieces of aerial image calculation information including the effective light source information 402, NA information 403, λ information 404, aberration information 405, polarization information 406, resist information 407, and mask data 410. More specifically, the user inputs (selects), to the processing apparatus 1 via the input unit 50, effective light source information "quadrupole illumination", NA information "0.73", λ information "248 nm", aberration information "no aberration", polarization information "non-polarization", resist information "out of consideration", and mask data "contact hole". Then, the control unit 20 displays, on the display unit 30, the pieces of aerial image calculation information input (selected) by the user, and determines them. This embodiment will exemplify a case in which the user inputs (selects) the pieces of aerial image calculation information stored in the storage unit 40. However, the user can input pieces of aerial image calculation information which are not stored in the storage unit 40.

In step S1004, the control unit 20 calculates the P operator 408. More specifically, the control unit 20 receives the pieces of aerial image calculation information, which are input (selected) by the user, from the storage unit 40. Based on the pieces of aerial image calculation information, the control unit 20 calculates the P operator 408 from, for example, equation (20) or (27). Also, the control unit 20 stores the calculated P operator 408 in the storage unit 40.

In step S1006, the control unit 20 calculates the aerial image 409. More specifically, the control unit 20 calculates the aerial image 409 from, for example, equation (21) or (22) using the P operator 408 and the pieces of aerial image calculation information input (selected) by the user. Also, the control unit 20 displays the aerial image 409 on the display unit 30, and stores it in the storage unit 40.

In this manner, the process of calculating the aerial image 409 by the aerial image calculation program 411 can calculate the aerial image 409 using the P operator 408. In other words, the process of calculating the aerial image 409 by the aerial image calculation program 411 can calculate the aerial image 409 without calculating the TCC that is necessary for the SOCS. This makes it possible to simplify the overall calculation, thus shortening the time taken to calculate the aerial image 409.

The calculation result of the aerial image 409 obtained by the aerial image calculation program 411 is analyzed as needed. The analysis of the aerial image includes, for example, the visual confirmation of the aerial image and the confirmation of the NILS (Normalized Intensity Log Slope), the contrast, the defocus characteristic (DOF characteristic), and the degree of matching, with the pattern data 401, of the aerial image. It is also possible to confirm the action of the aerial image 409 on the resist. The analysis of the aerial image can take any form known to those skilled in the art.

The process of calculating the aerial image 409 by the aerial image calculation program 411 can be applied to various forms of the model-based RET.

The effect of the process of calculating the aerial image 409 by the aerial image calculation program 411, the application of this calculation process to the model-based RET, and the like will be explained in detail in each of the following embodiments.

First Embodiment

The effect of a process of calculating an aerial image 409 by an aerial image calculation program 411 will be explained in the first embodiment. In the first embodiment, 64-bit Opteron® is used as a CPU which constitutes a control unit 20 of a processing apparatus 1, and a memory of about 10 gigabytes is used as a storage unit 40. The aerial image calculation program 411 is generated using MAT-LAB®, and the time taken to calculate the aerial image 409 (calculation time) is compared with that in the prior art (SOLS).

Figure 4B:
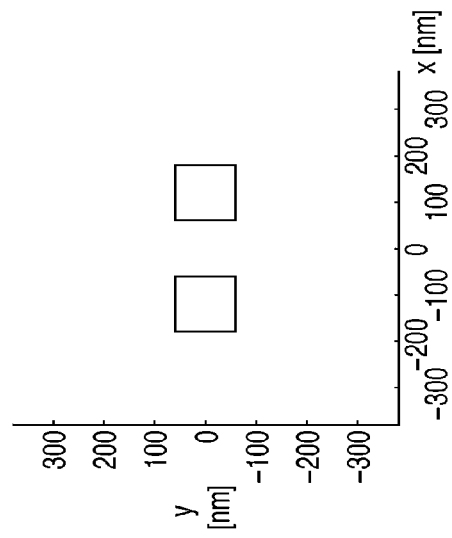
Figure 4D:
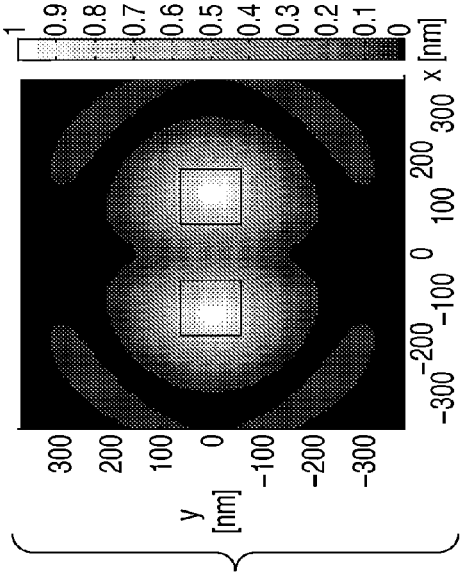
Figure 4A:
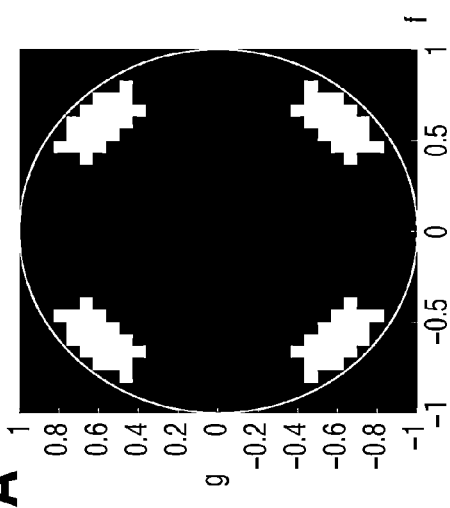

The first embodiment assumes a case in which an exposure apparatus uses a projection optical system having an NA of 0.73 (corresponding to NA information 403), and exposure light having a wavelength of 248 nm (corresponding to λ information 404). In addition, the projection optical system is assumed to have no aberration (corresponding to aberration information 405), the illumination light is assumed to be non-polarized (corresponding to polarization information 406), and a resist applied on a wafer is not taken into consideration (corresponding to resist information 407). The effective light source is assumed to use quadrupole illumination, as shown in FIG. 4A. Pattern data (target pattern) 401 is assumed to include two contact hole patterns. In addition, the diameter of each contact hole pattern is assumed to be 120 nm, and the centers of the respective contact hole patterns are assumed to be (−120 nm, 0 nm) and (120 nm, 0 nm). Under this assumption, mask data 410 is as shown in FIG. 4B. In addition, the division number of the pupil of the projection optical system in a normal state is assumed to be 31, and that in executing Fourier transformation is assumed to be 1,024.

Figure 4C:
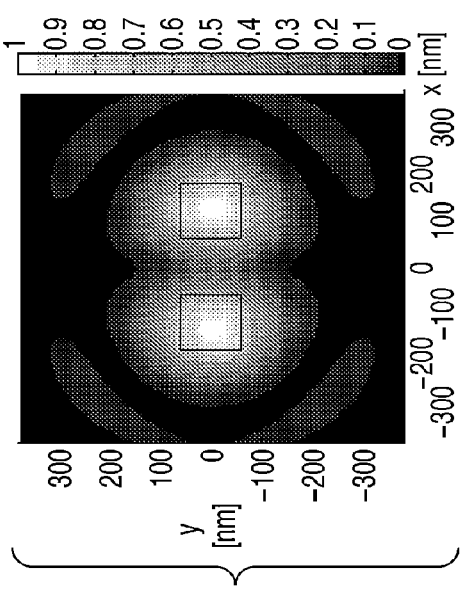

The control unit 20 calculates a P operator 408 based on the above-described pieces of aerial image calculation information. At this time, the time taken to calculate the P operator 408 is equal to or less than 0.1 sec. Also, the control unit 20 performs the singular value decomposition of the P operator 408 (i.e., decomposes it into eigenvalues and eigenfunctions). At this time, the time taken for the singular value decomposition of the P operator 408 is 0.4 sec. When a complete aerial image is calculated by adding all the eigenfunctions, an aerial image 409 as shown in FIG. 4C is obtained. The time taken to calculate the aerial image 409 is about 33.0 sec. Note that the aerial image 409 shown in FIG. 4C is normalized assuming that its maximum value is 1.

The aerial image is calculated using the SOCS next. The control unit 20 calculates the TCC based on equation (2). At this time, the time taken to calculate the TCC is about 1,152 sec. Also, the control unit 20 decomposes the TCC into eigenvalues and eigenfunctions based on equation (4) (first calculation step). At this time, the time taken to decompose the TCC into eigenvalues and eigenfunctions is about 4.9 sec. When a complete aerial image is calculated by adding all the eigenfunctions (second calculation step), an aerial image as shown in FIG. 4D is obtained. The time taken to calculate the aerial image is about 1,209 sec. Note that the aerial image as shown in FIG. 4D is normalized assuming that its maximum value is 1.

In this manner, the process of calculating the aerial image 409 by the aerial image calculation program 411 can calculate the aerial image in a shorter period of time than in the conventional SOCS. When the aerial image 409 shown in FIG. 4C and the aerial image shown in FIG. 4D are compared, they match each other on the order of $1.0 \times 10^{-15}$, and therefore a correct simulation result is obtained.

Also, the aerial image calculation program 411 can calculate the TCC in a shorter period of time. The SOCS takes about 1,152 sec to calculate the TCC, as described above. In contrast, the control unit 20 takes only about 0.9 sec to calculate the TCC based on equation (28) after calculating the P operator 408.

Second Embodiment

A process of calculating an aerial image 409 when the aberration of the projection optical system is taken into consideration or when the illumination light is polarized will be explained in the second embodiment. A process of calculating an aerial image 409 when the effective light source has a variation in light intensity (the light intensity of the light-emitting part is nonuniform) or when the diffraction efficiency of light diffracted by the mask pattern changes will also be explained in the second embodiment.

When the aberration of the projection optical system is taken into consideration, it is only necessary to include the aberration in the pupil function and calculate a P operator 408 using equation (27). In this case, each element of the P operator 408 includes a conjugate element corresponding to the aberration of the projection optical system. The aberration of the projection optical system can be included in $P'_i$ in equation (27) in this way.

Figure 5:
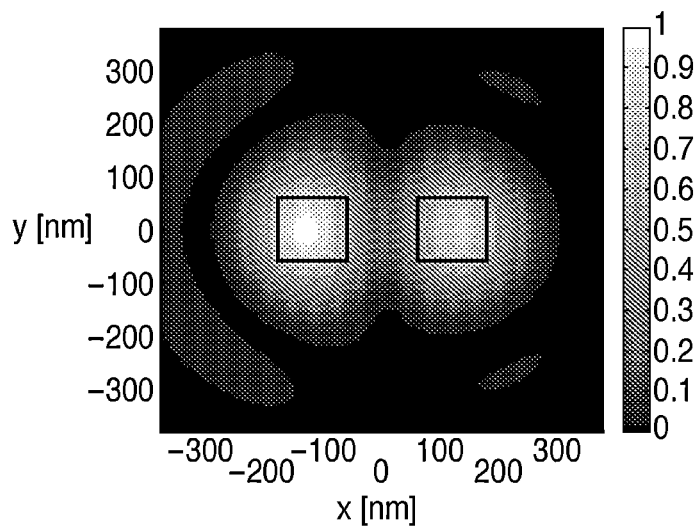
FIG. 5 is a chart for explaining the second embodiment according to the present invention, which shows an aerial image calculated by an aerial image calculation program when a projection optical system has aberration.

Pieces of aerial image calculation information other than aberration information 405 are assumed to be the same as in the first embodiment. An aberration of 50 mλ is substituted into the seventh term (low-order coma aberration) of the Fringe Zernike polynomial as the aberration information 405. FIG. 5 shows the result of calculating the aerial image 409 using the P operator 408 for mask data 410 shown in FIG. 4B, in accordance with an aerial image calculation program 411. Referring to FIG. 5, two contact hole patterns exhibit aerial image elements having different sizes, that is, the left contact pattern exhibits a larger aerial image element. This is because a low-order coma aberration is set as the aberration of the projection optical system.

Since the defocus is one type of wavefront aberration, it can be included in the process of calculating the aerial image 409 by the aerial image calculation program 411. When a resist applied on a wafer is assumed as a parallel plate, the resist can be said to generate spherical aberration. It is therefore possible to include resist-related aberration in the process of calculating the aerial image 409 by the aerial image calculation program 411.

When the illumination light is polarized, it is only necessary to three-dimensionally express the polarization by making σ=1 for the effective light source correspond to the NA of the projection optical system. More specifically, the pupil function need only be multiplied by factors associated with polarization. The factors associated with polarization include a factor which produces an effect of allowing x-polarized light remain as x-polarized, that which produces an effect of turning x-polarized light into y-polarized light, that which produces an effect of turning x-polarized light into z-polarized light, that which produces an effect of turning y-polarized light into x-polarized light, that which produces an effect of allowing y-polarized light remain as y-polarized, and that which produces an effect of turning y-polarized light into z-polarized light. Accordingly, three P operators for x-polarization, y-polarization, and z-polarization are derived.

A light intensity distribution I(x, y) formed on the wafer surface can be calculated by:

$$I(x,y) = \langle \phi'_{2D} | P_x^+ P_x + P_y^+ P_y + P_z^+ P_z | \phi'_{2D} \rangle \quad (30)$$

where $P_x$, $P_y$, and $P_z$ are the P operators for x-polarization, y-polarization, and z-polarization, respectively.

Figure 6:
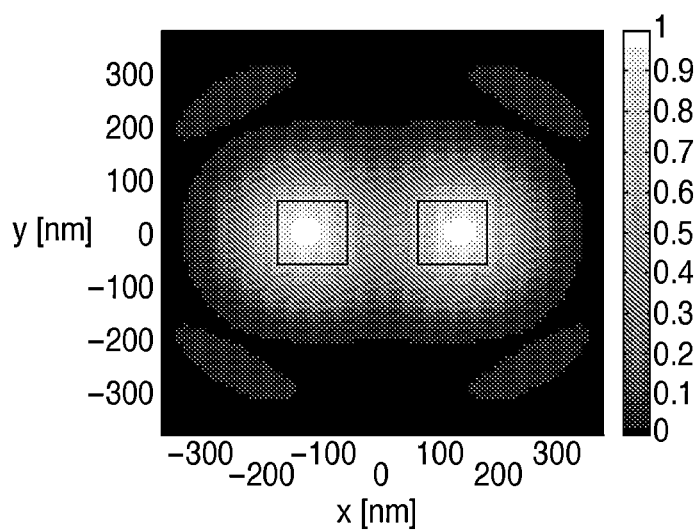
FIG. 6 is a chart for explaining the second embodiment according to the present invention, which shows an aerial image calculated by the aerial image calculation program when illumination light is polarized.

Pieces of aerial image calculation information other than polarization information 406 are assumed to be the same as in the first embodiment. That all the point sources are polarized in the x direction is set as the polarization information 406. FIG. 6 shows the result of calculating the aerial image 409 using the P operators $P_x$, $P_y$, and $P_z$ for x-polarization, y-polarization, and z-polarization, respectively, in accordance with the aerial image calculation program 411. When FIGS. 6 and 4C are compared, the aerial image 409 when the illumination is polarized is more blurred than that when the illumination light is non-polarized.

A P operator is defined by:

$$P_{pol} = \begin{pmatrix} P_x \\ P_y \\ P_z \end{pmatrix} \quad (31)$$

where $P_{pol}$ is a P operator including the effect of polarization. Since the elements of $P_{pol}$ are fewer than those of the TCC, the use of $P_{pol}$ allows calculating the aerial image 409 in a shorter period of time than in the SOCS.

One important conclusion can be derived herein. That is, one P operator has conventionally been defined by one matrix, but a plurality of P operators may be defined by different matrices according to the present invention. For example, one P operator $P_{pol}$ is defined by taking account of polarization in the second embodiment, but three P operators can be defined for respective polarized light components. A plurality of P operators may also be defined by dividing the effective light source into a plurality of regions.

If the effective light source has a variation in light intensity (the light intensity of the light-emitting part is nonuniform), the intensity of each point source need only be included in the P operator. For example, when the intensity of the i-th point source is $S_i$, the P operator is defined by:

$$P_{2D} = \begin{pmatrix} \sqrt{S_1}\, Y[P'_1] \\ \sqrt{S_2}\, Y[P'_2] \\ \vdots \\ \sqrt{S_N}\, Y[P'_N] \end{pmatrix} \quad (32)$$

The diffracted light distribution upon normal incidence often differs from that upon oblique incidence (i.e., the diffraction efficiency often changes) along with advance in the micropatterning of the mask pattern. In this case, equation (27) need only be rewritten as:

$$P_{2D} = \begin{pmatrix} Y[P''_1] \\ Y[P''_2] \\ \vdots \\ Y[P''_N] \end{pmatrix} \quad (33)$$

Note that $P''_i$ in equation (33) includes the diffraction efficiency when light emanating from the i-th point source obliquely enters the wafer surface.

Third Embodiment

The third embodiment will exemplify a case in which a process of calculating an aerial image 409 by an aerial image calculation program 411 is applied to the model-based RET. The OPC (Optical Proximity Correction) is known as a basic approach to the RET.

Figure 7A:
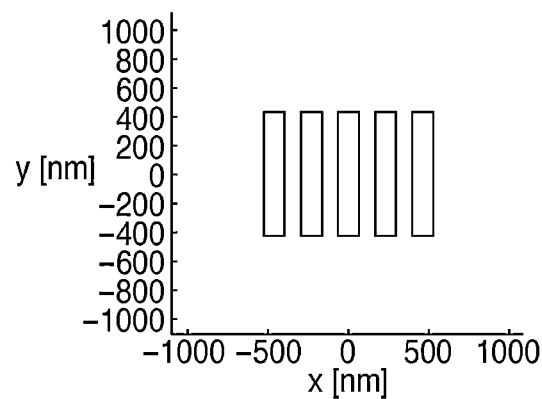
Figure 7B:
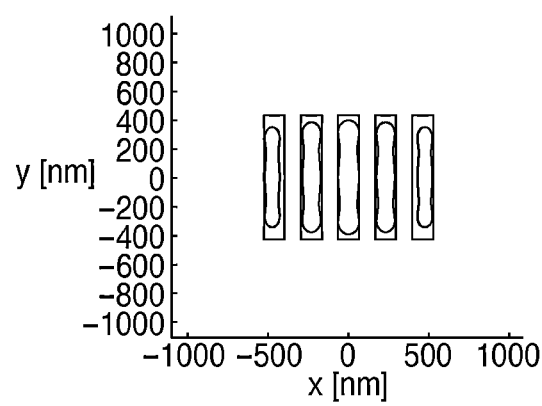

Pieces of aerial image calculation information other than mask data 410 are assumed to be the same as in the first embodiment. In the third embodiment, five bars each having a width of 120 nm and a length of 840 nm, as shown in FIG. 7A, are assumed as the mask data 410. FIG. 7B shows an aerial image 409 calculated by the aerial image calculation program 411 in this case. When FIGS. 7A and 7B are compared, the mask data 410 differs from the aerial image 409 calculated by the aerial image calculation program 411. To solve this problem, based on the OPC, the mask data 410 is changed so that the aerial image 409 calculated by the aerial image calculation program 411 (i.e., a pattern transferred by exposure) becomes close to pattern data 401.

To determine optimal mask data 410 in the OPC, a loop for calculating the aerial image 409 by changing the mask data 410 must be repeated until the difference between the aerial image 409 and the pattern data 401 decreases sufficiently. For this reason, when a long time is taken to calculate the aerial image 409, a long time is, in turn, taken to determine optimal mask data 410. However, since the aerial image calculation program 411 can calculate the aerial image 409 in a shorter period of time, it is suitable for the OPC.

Figure 7C:
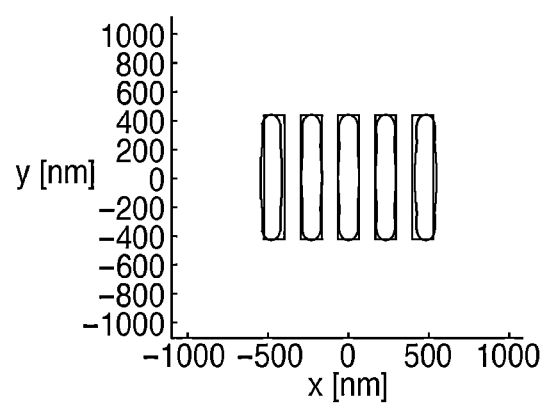

More specifically, to determine optimal mask data 410, the control unit 20 repeats the process of calculating the aerial image 409 by the aerial image calculation program 411 for the above-described five bars, thereby changing the mask data 410. With this operation, final mask data 410 is obtained, in which the leftmost and rightmost bars each have a width of 134 nm and a length of 968 nm, the second bars from the left and right each have a width of 127 nm and a length of 930 nm, and the central bar has a width of 120 nm and a length of 929 nm. FIG. 7C shows an aerial image 409 calculated by the aerial image calculation program 411 using the mask data 410. When FIGS. 7B and 7C are compared, the aerial image 409 shown in FIG. 7C is closer to the pattern data 401 than that 409 shown in FIG. 7B.

In this manner, applying the process of calculating the aerial image 409 by the aerial image calculation program 411 to the OPC makes it possible to generate mask data 410 in a shorter period of time.

Fourth Embodiment

A method of calculating an aerial image 409 in a shorter period of time than in the previous embodiments in a process of calculating the aerial image 409 by an aerial image calculation program 411 will be explained in the fourth embodiment.

When a two-dimensional aerial image 409 is calculated, a P operator 408 can be expressed by equation (27), as described above. Letting L be the pupil division number, and N be the number of point sources, the P operator is defined by a matrix of N rows and $(2L)^2$ columns. Since the rows of the P operator are independent of each other, the rank of the P operator is N. In other words, the singular value decomposition of the P operator yields N eigenvalues and N eigenfunctions. N eigenvalues and N eigenfunctions are therefore necessary to calculate a complete aerial image 409. In practice, however, N eigenvalues and N eigenfunctions need not be used, as will be described later.

Pieces of aerial image calculation information other than mask data 410 are assumed to be the same as in the first embodiment. In the fourth embodiment, five bars each having a width of 120 nm and a length of 840 nm, as shown in FIG. 7A, are assumed as the mask data 410.

The effective light source shown in FIG. 4A has 92 point sources for numerical calculation. This means that there are 92 eigenvalues and 92 eigenfunctions. The eigenfunctions corresponding to the eigenvalues are rearranged in descending order of the squares of the eigenvalues.

FIG. 8A is a graph obtained by plotting the squares of the eigenvalues, which are normalized assuming that the square of the largest eigenvalue is 1. As described above, there are 92 eigenvalues. Letting i be the eigenvalue number, that is, the i-th eigenvalue, the square of the i-th eigenvalue is 0.01 or less if i is 10 or more, as shown in FIG. 8A. Also, the square of the i-th eigenvalue is 0.001 or less if i is 49 or more. In this manner, the square of the i-th eigenvalue rapidly decreases along with an increase in the eigenvalue number i.

Let E be the sum of the squares of all the eigenvalues, and Ei be the sum of the squares of the first to i-th eigenvalues herein. When $E_i/E=1$, a complete aerial image 409 can be calculated. When the light intensity is set such that the central bar in a section y=0 has a line width of 120 nm in the complete aerial image 409, the leftmost bar has a line width of 98.44 nm.

Figure 8B:
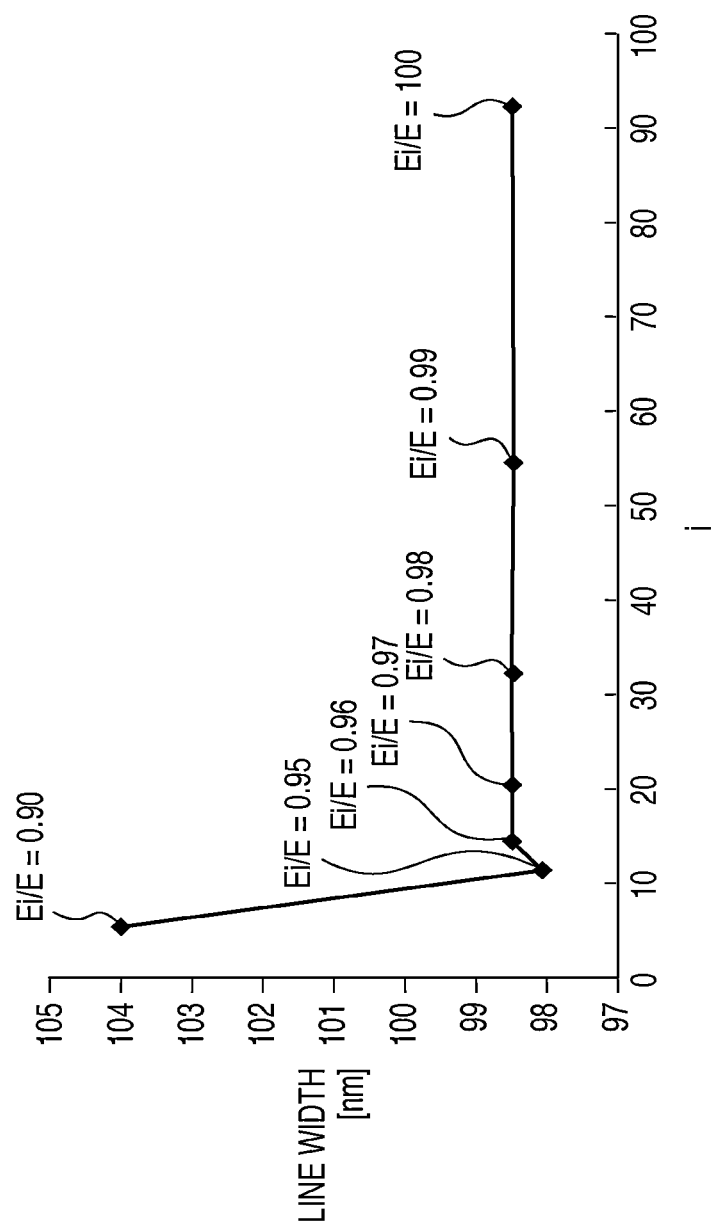

The square of the eigenvalue rapidly decreases along with an increase in the eigenvalue number i, and the special frequency of the eigenfunction increases along with an increase in the eigenvalue number i. According to this principle, as the eigenvalue number i increases, the contribution of the i-th eigenvalue to the formation of an aerial image decreases. FIG. 8B is a graph showing the difference between a complete aerial image and an approximate aerial image (i.e., an aerial image calculated from some eigenvalues and eigenfunctions). In FIG. 8B, the abscissa indicates the eigenvalue number i, and the ordinate indicates the line width of the leftmost bar when an aerial image is calculated using the first to i-th eigenfunctions and eigenvalues. Referring to FIG. 8B, when $E_i/E=0.96$ or more (i.e., the eigenvalue number i is 14 or more), the difference between the complete aerial image and the approximate aerial image is 0.1 nm or less. Hence, an aerial image almost identical to the complete aerial image can be calculated using not 92 eigenvalues and 92 eigenfunctions but 14 eigenvalues and 14 eigenfunctions. This makes it possible to reduce the time taken to calculate the aerial image by about 85%.

A required accuracy of the aerial image differs depending on the evaluation target. Through the examinations of various cases, the inventor of the present invention found that when $E_i/E$ is 0.96 or more, no problems are posed from the viewpoint of practical application. Furthermore, the inventor of the present invention found that when $E_i/E$ is 0.98 or more, no problems are posed for almost all the evaluation targets.

In this manner, the aerial image 409 can be calculated in a shorter period of time than in the previous embodiments by adjusting $E_i/E$ in accordance with the evaluation target in the process of calculating the aerial image 409 by the aerial image calculation program 411.

Another method of calculating the aerial image 409 in a shorter period of time than in the previous embodiments includes a method of compressing the P operator 408. For example, consider one-dimensional imaging. If all the components of the j-th column of the P operator 408 are 0, the j-th column of the P operator 408 is not necessary at all. Then, the P operator 408 can be compressed by eliminating columns in each of which all the components are 0 in the P operator 408 as indicated by:

$$\begin{pmatrix} 0 & 0 & 1 & 1 & 1 & 0 & 0 \\ 0 & 1 & 1 & 1 & 0 & 0 & 0 \end{pmatrix} \begin{pmatrix} e^{-2\pi v_1 x} \\ e^{-2\pi v_2 x} \\ e^{-2\pi v_3 x} \\ e^{-2\pi v_4 x} \\ e^{-2\pi v_5 x} \\ e^{-2\pi v_6 x} \\ e^{-2\pi v_7 x} \end{pmatrix} = \begin{pmatrix} 0 & 1 & 1 & 1 \\ 1 & 1 & 1 & 0 \end{pmatrix} \begin{pmatrix} e^{-2\pi v_2 x} \\ e^{-2\pi v_3 x} \\ e^{-2\pi v_4 x} \\ e^{-2\pi v_5 x} \end{pmatrix} \quad (34)$$

Referring to equation (34), a P operator 408 of two rows and seven columns is compressed into that of two rows and four columns.

Likewise, the P operator 408 can be compressed even in two-dimensional imaging. More specifically, the P operator 408 can be compressed by eliminating columns in each of which all the components are 0 in the P operator 408. The use of the P operator 408 compressed in this way allows the singular value decomposition in a shorter period of time than in the previous embodiments. This makes it possible to calculate the aerial image 409 in a shorter period of time than in the previous embodiments.

Figure 9A:
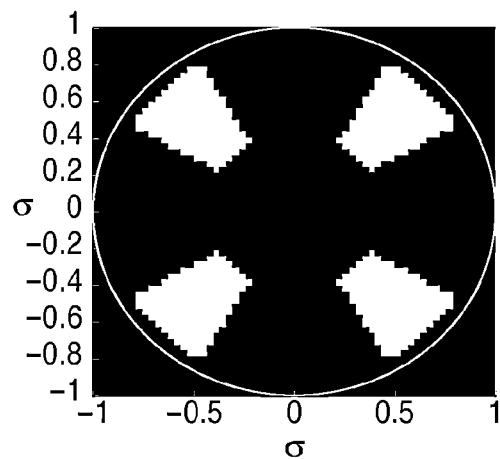
Figure 9B:
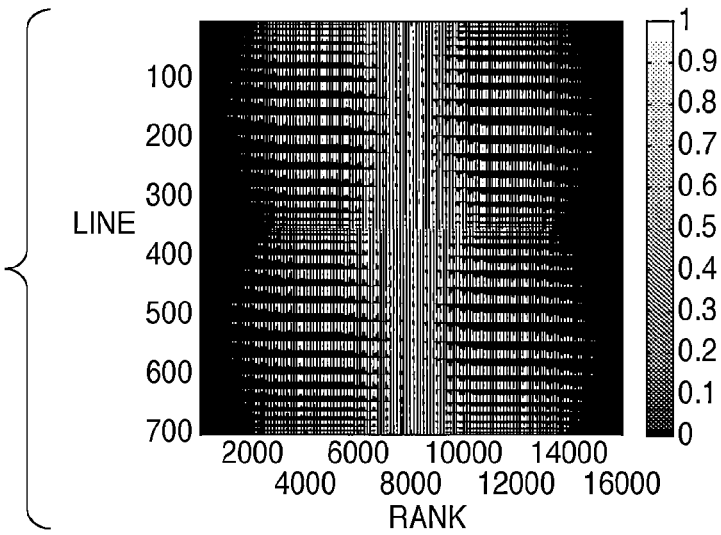
Figure 9C:
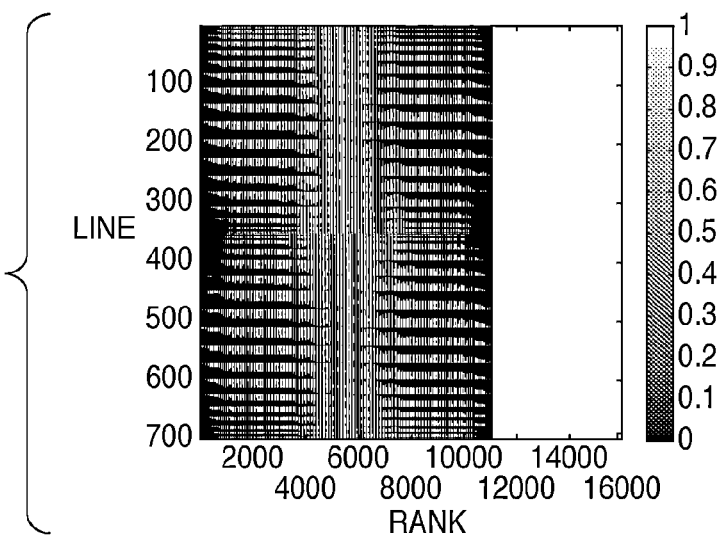

A case in which the P operator 408 is compressed will be exemplified in detail. The effective light source is assumed to use quadrupole illumination and include 712 point sources, as shown in FIG. 9A. FIG. 9B shows a P operator 408 which is normally calculated in accordance with the aerial image calculation program 411 (i.e., uncompressed). The P operator 408 shown in FIG. 9B is a matrix of 712 rows and 16,129 columns, in which the white portion corresponds to 1, and the black portion corresponds to 0. FIG. 9C shows a P operator 408 compressed through a predetermined process. The P operator 408 shown in FIG. 9C is a matrix of 712 rows and 10,641 columns, in which the white portion corresponds to 1, and the black portion corresponds to 0.

The time taken for the singular value decomposition of the P operator 408 shown in FIG. 9B is about 34.0 sec. In contrast, the time taken for the singular value decomposition of the P operator 408 shown in FIG. 9C is about 24.3 sec. In this manner, the compression of the P operator 408 improves the speed at which the singular value decomposition is performed for the P operator 408.

Fifth Embodiment

A method of generating mask data 410 using the model-based RET which uses a P operator 408, particularly a process of calculating an aerial image 409 by an aerial image calculation program 411 will be explained in the fifth embodiment. This method generates mask data 410 by inserting assist (auxiliary) patterns in the pattern to be transferred by exposure.

Figure 10:
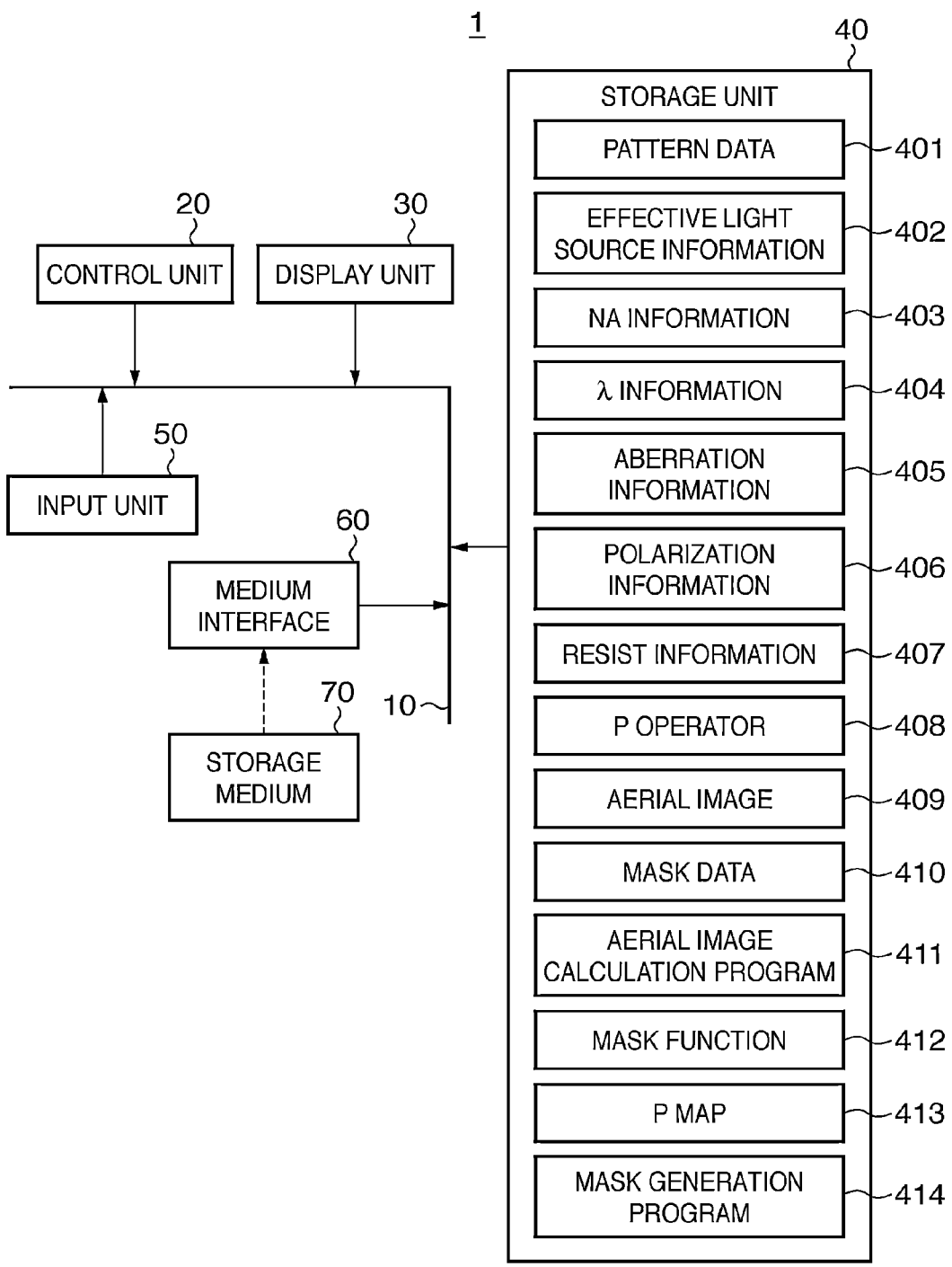
FIG. 10 is a block diagram showing the configuration of a processing apparatus according to the fifth embodiment of the present invention.

FIG. 10 is a schematic block diagram showing the configuration of a processing apparatus 1 according to the fifth embodiment. The processing apparatus 1 shown in FIG. 10 has basically the same configuration as that of the processing apparatus 1 shown in FIG. 1, but a storage unit 40 additionally stores a mask function 412, P map 413, and mask generation program 414. Effective light source information 402, NA information 403, λ information 404, aberration information 405, polarization information 406, resist information 407, the mask data 410, and the mask function 412 will be collectively referred to as pieces of P map calculation information hereinafter.

The mask function 412 is a parameter for generating a P map 413 (to be described later), and is pattern data 401 itself or the one obtained by transforming the pattern data 401 in accordance with a predetermined rule.

The P map 413 is a partial coherent map obtained by multiplying the eigenfunctions of the P operator 408 by the diffracted light distribution, and Fourier-transforming or adding the products.

The difference between a process of calculating the P map 413 and that of calculating the aerial image 409 will be explained herein. The process of calculating the aerial image 409 multiplies the eigenfunctions of the P operator 408 by the diffracted light distribution on the mask data 410, Fourier-transforms the products, and calculates the squares of the absolute values of the Fourier transforms. The squares of the absolute values are then multiplied by the squares of the absolute values of their corresponding eigenvalues, and the products are added. With this operation, the aerial image 409 is calculated. In contrast, the P map 413 is calculated by multiplying the eigenfunctions of the P operator 408 by the diffracted light distribution on the mask data 410, Fourier-transforming the products, multiplying the Fourier transforms by their corresponding eigenvalues, and adding the products. Therefore, the aerial image 409 always takes positive values, but the P map 413 does not always take positive values. The P map 413 means a map (function) which represents, when a plurality of pattern elements are inserted on the object plane of the projection optical system, the influence they inflict on each other.

The mask generation program 414 is a program for generating mask data 410 based on the P map 413.

A process of generating the mask data 410 by the mask generation program 414 will be explained below by paying particular attention to the insertion of assist patterns.

Figure 11A:
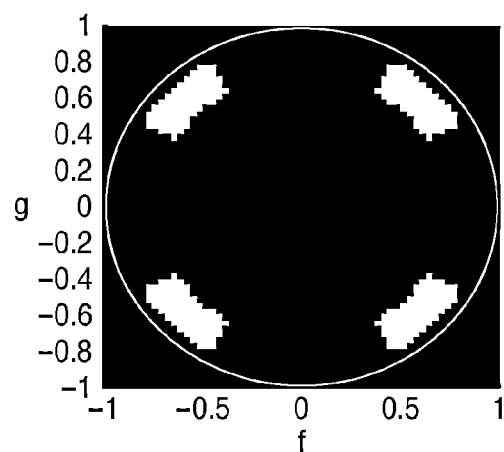
Figure 11B:
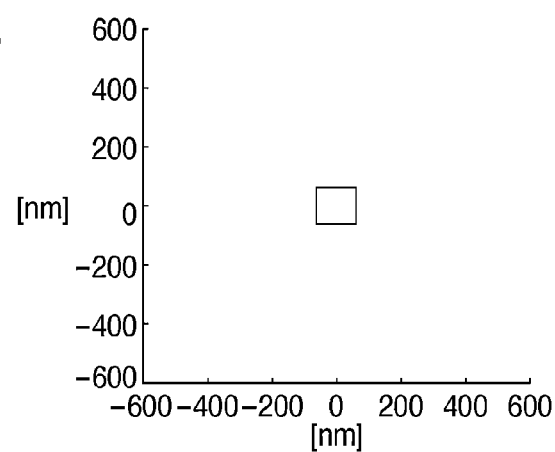

The fifth embodiment assumes a case in which an exposure apparatus uses a projection optical system having an NA of 0.73 (corresponding to the NA information 403), and exposure light having a wavelength of 248 nm (corresponding to the λ information 404). In addition, the projection optical system is assumed to have no aberration (corresponding to the aberration information 405), the illumination light is assumed to be non-polarized (corresponding to the polarization information 406), and a resist applied on a wafer is not taken into consideration (corresponding to the resist information 407). The effective light source (corresponding to the effective light source information 402) is assumed to use quadrupole illumination, as shown in FIG. 11A. Pattern data (target pattern) 401 is assumed to be an isolated contact hole pattern, which has a side length of 120 nm, as shown in FIG. 11B.

The fifth embodiment also assumes a so-called dark field with a clear aperture. In this case, a pattern is formed on a resist portion irradiated with the exposure light.

Since various values can be set to the wavelength λ of the exposure light, and the numerical aperture NA of the projection optical system in the exposure apparatus, the mask pattern size is preferably normalized by (λ/NA). For example, if λ=248 nm and NA=0.73, a pattern having a size of 100 nm is normalized to 0.29 by the above-described method. This normalization will be referred to as k1 conversion hereinafter.

The k1 conversion value of an isolated contact hole pattern having a diameter of 120 nm is 0.35. If the k1 conversion value is 0.5 or less, a sinusoidal aerial image is obtained. To make the best use of the features of a sinusoidal wave, assist patterns have conventionally been inserted at a cycle half the diameter of the isolated contact hole pattern. For example, if the center of the isolated contact hole pattern as a desired pattern lies at (0, 0), assist patterns have been inserted at eight positions, that is, (±240, 0), (0, ±240), (240, ±240), and (−240, ±240).

In the mask generation program 414, first, the mask function 412 is set as the target pattern itself, that is, an isolated contact hole pattern having a diameter of 120 nm.

As has been described in the fourth embodiment, as the eigenvalue of the P operator 408 increases, the contribution of the eigenfunction of the P operator 408 to the formation of the aerial image 409 increases. To attain this state, the eigenvalues of the P operator 408 are rearranged in descending order of the squares of the eigenvalues. An eigenfunction corresponding to the i-th eigenvalue rearranged in this way will be referred to as the i-th eigenfunction hereinafter.

Figure 11C:
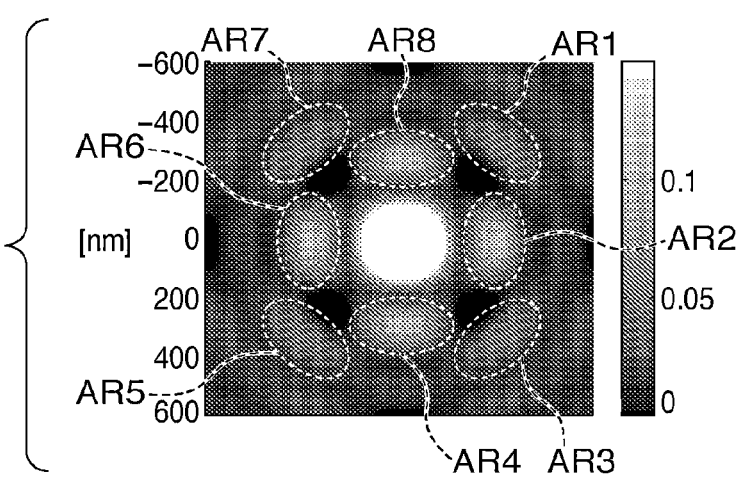

The first eigenfunction of the P operator 408 makes a largest contribution to the formation of the aerial image 409. For this reason, only the first eigenfunction of the P operator 408 is considered. The first eigenfunction of the P operator 408 is multiplied by the diffracted light distribution of the mask function 412, and the product is Fourier-transformed. FIG. 11C shows a P map 413 calculated in this way.

In FIG. 11C, the values in regions AR1 to AR8 surrounded by the white dotted lines are relatively large. In other words, light components diffracted by the regions AR1 to AR8 interfere with that diffracted by the target pattern, thereby improving the image intensity. Hence, when opening patterns are inserted in the regions AR1 to AR8 surrounded by the white dotted lines, the image intensity at the position (0, 0) increases.

Figure 11D:
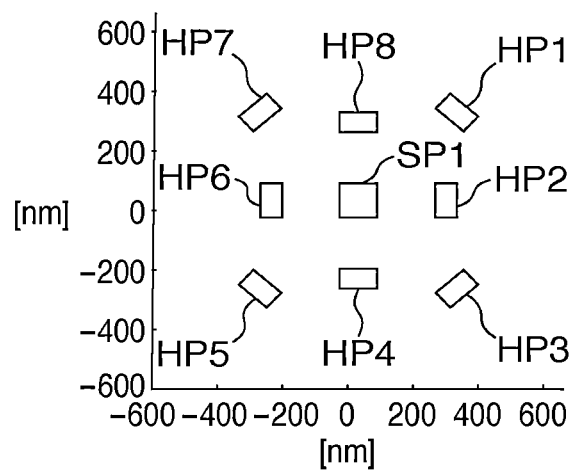

Assist patterns HP1 to HP8 are inserted in the regions AR1 to AR8 surrounded by the white dotted lines, as shown in FIG. 11D. The original purpose is to transfer by exposure an isolated contact hole pattern having its center at (0, 0) onto the wafer surface, as described above. When the P map 413 is analyzed, a position at which the P map 413 takes a peak value is (0, 0). The assist patterns HP1 to HP8 are set such that the center of a main pattern SP having the same size as that of the pattern data 401 becomes (0, 0). A mask is then fabricated by using the mask pattern shown in FIG. 11D as the mask data 410. With this operation, light components diffracted by the assist patterns HP1 to HP8 act on that diffracted by the main pattern SP. This makes it possible to transfer the isolated contact hole pattern as the target pattern with high accuracy, thus improving the resolving performance.

Figure 12:
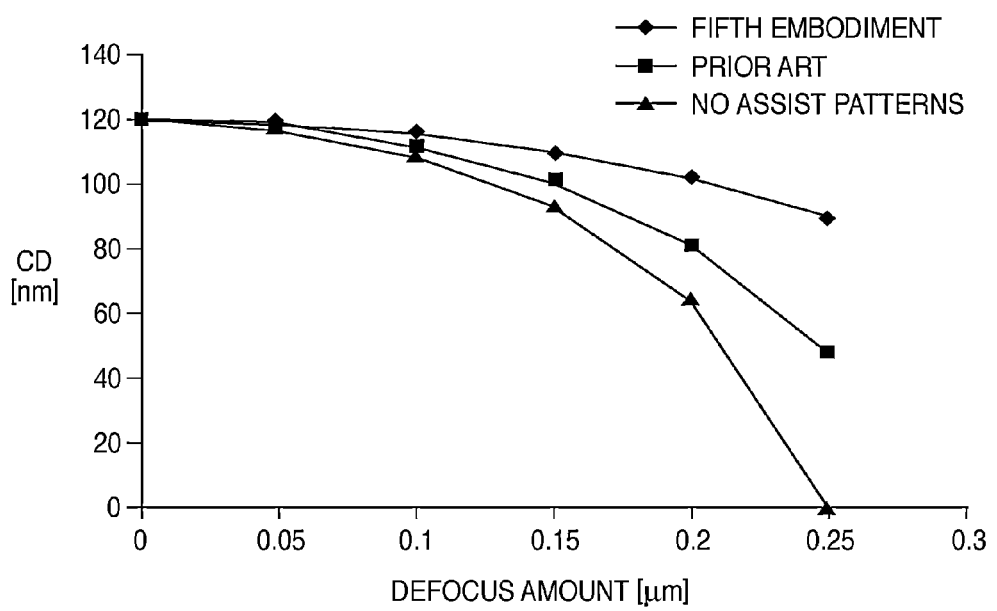
FIG. 12 is a graph showing the result of a comparison of the imaging performances of a mask having no assist patterns, that in which assist patterns are inserted according to the prior art, and that in which assist patterns are inserted according to the fifth embodiment.

FIG. 12 shows the result of a comparison of the imaging performances of a mask having no assist patterns, that in which assist patterns are inserted according to the prior art, and that in which assist patterns are inserted according to the fifth embodiment (i.e., by the mask generation program 414). In FIG. 12, the abscissa indicates the defocus amount, and the ordinate indicates the diameter of the contact hole pattern (CD). The imaging performance of each mask is evaluated based on a change in the diameter of the isolated contact hole pattern (CD) with respect to a change in defocus. The size of each assist pattern in the prior art is 90 nm×90 nm. The size of each assist pattern in the fifth embodiment will be described later.

The imaging performance of the mask having no assist patterns, and that of the mask in which assist patterns are inserted according to the prior art will be compared with reference to FIG. 12. In this case, a change in the diameter of the isolated contact hole pattern with respect to a change in defocus in the mask in which assist patterns are inserted according to the prior art is significantly smaller than that in the mask having no assist patterns. In other words, the mask in which assist patterns are inserted according to the prior art exhibits an imaging characteristic better than that of the mask having no assist patterns.

Likewise, the imaging performance of the mask in which assist patterns are inserted according to the prior art, and that of the mask in which assist patterns are inserted according to the fifth embodiment will be compared. Referring to FIG. 12, the mask in which assist patterns are inserted according to the fifth embodiment exhibits an imaging characteristic better than that of the mask in which assist patterns are inserted according to the prior art.

The P map 413 shown in FIG. 11C will be explained in detail. On the P map 413 shown in FIG. 11C, the first position which exhibits a value more than a predetermined threshold and takes a peak value is detected. The position which takes a peak value means a position at which a value obtained by differentiating the P map 413 with respect to the position is zero. The first position is a vector, which includes pieces of information on the distance and direction. In the fifth embodiment, the first positions are eight positions, that is, (±285, 0), (0, ±285), (±320, 320), and (±320, −320). Note that in FIG. 11C the P map 413 is normalized assuming that its maximum value is 1, and the threshold is 0.03. As the first positions are calculated, assist patterns are inserted on the light intensity distribution on the P map 413 as faithfully as possible. In the fifth embodiment, assist patterns of rotationally symmetrical rectangles each having a size of 70 nm×120 nm are inserted (arranged) at the eight positions.

It is difficult to calculate the peak position by numerical calculation. Using the fact that the peak position and the barycentric position are nearly the same, the barycenter of a region which exhibits a value more than the predetermined threshold on the P map 413 may be calculated and set as the first position.

Figure 11E:
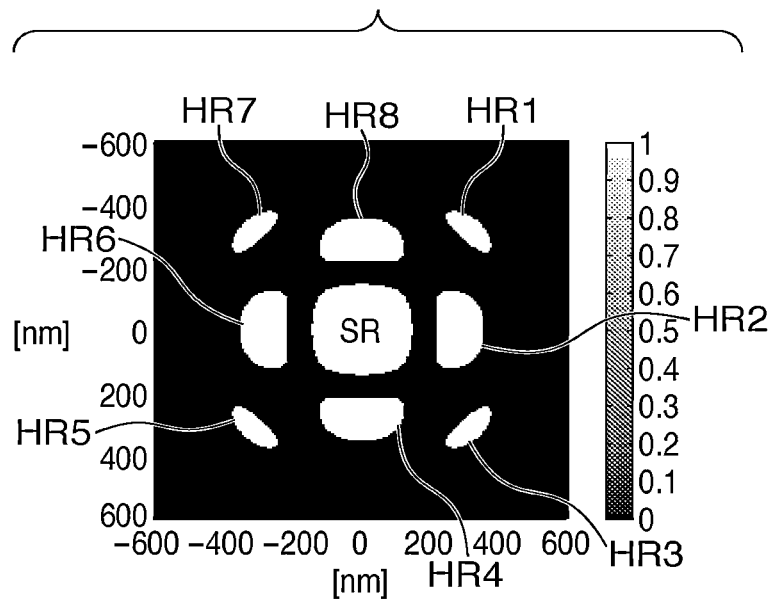

For example, FIG. 11E shows a map obtained by setting each region which exhibits a value equal to or more than the threshold of 0.03 as 1, and setting each region which exhibits a value less than the threshold of 0.03 as 0 on the P map 413 shown in FIG. 11C. In FIG. 11E, a region SR corresponds to the main pattern SP as the isolated contact hole pattern (desired pattern). Regions HR1 to HR8 correspond to regions (i.e., the regions AR1 to AR8) to insert (arrange) the assist patterns. Hence, the assist patterns need only be set by calculating the barycenters of the regions HR1 to HR8.

Sixth Embodiment

A method of generating mask data 410 when pattern data (target pattern) 401 is a pattern formed from n contact hole patterns will be explained in the sixth embodiment.

As has been described in the fifth embodiment, generating mask data 410 using a P map 413 improves the imaging performance of a mask having an isolated contact hole pattern. Likewise, generating mask data 410 using a P map 413 also makes it possible to improve the imaging performance of a mask having a pattern formed from n contact hole patterns.

Figure 13A:
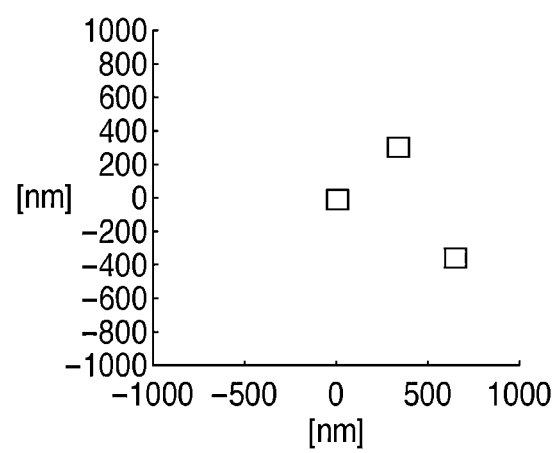

Pieces of P map calculation information other than a mask function 412 are assumed to be the same as in the fifth embodiment. The pattern data (target pattern) 401 is assumed to be a pattern including three 120-nm square contact hole patterns, as shown in FIG. 13A. The centers of the three contact hole patterns are (0, 0), (320, 320), and (640, −350). The mask function 412 is the target patter itself, that is, a pattern including three contact hole patterns each having a diameter of 120 nm, as in the fifth embodiment.

Figure 13B:
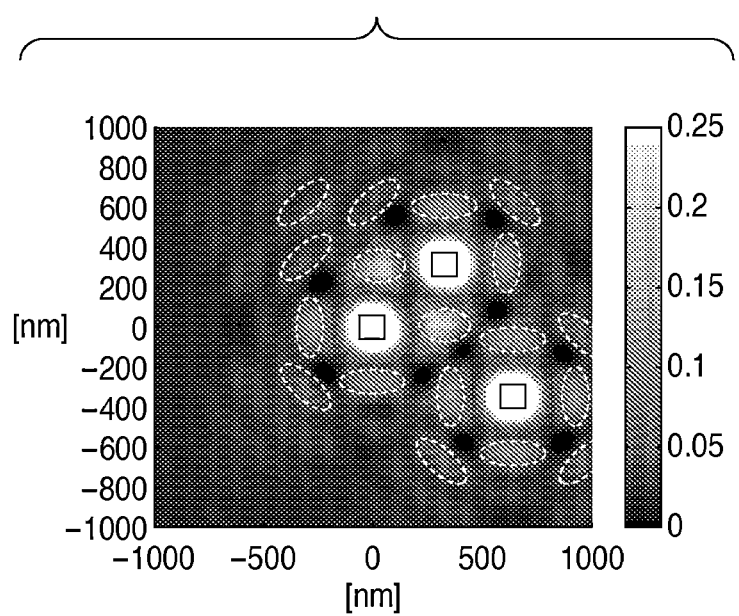

The first eigenfunction of a P operator 408 makes a largest contribution to the formation of an aerial image 409. For this reason, only the first eigenfunction of the P operator 408 is considered. The first eigenfunction of the P operator 408 is multiplied by the diffracted light distribution of the mask function 412, and the product is Fourier-transformed. FIG. 13B shows a P map 413 calculated in this way.

In FIG. 13B, a region surrounded by each white dotted line exhibits a value equal to or more than a certain threshold (0.025 in the fifth embodiment) and corresponds to a peak position. Assist patterns need only be inserted (arranged) in the regions surrounded by the white dotted lines shown in FIG. 13B.

How to determine the main pattern corresponding to the pattern data 401 will be explained next. Attention is paid to pattern data having its center at the position (0, 0). When the P map 413 is analyzed, it has a peak at a position shifted from (0, 0) by (δx, δy). When a 120-nm square main pattern having its center at the position (0, 0) is arranged, it is transferred by exposure while being shifted by (δx, δy) due to the optical proximity effect.

The positional shift can be canceled by arranging a main pattern having its center at the position (−δx, −δy). Likewise, when the main patterns are contact hole patterns having their centers at the positions (320, 320) and (640, −350), they are similarly inserted (arranged) at positions different from that of the pattern data 401.

The analysis of the P map 413 also makes it possible to predict the degree of deformation of the main pattern. It is therefore possible to determine the shape of the main pattern based on its deformation.

After the main pattern is determined as a pattern represented by the pattern data 401 itself based on the P map 413, the positional shift and shape of the main pattern may be corrected by adopting the OPC.

Assist patterns are often arranged too close to each other, depending on the arrangement of the contact hole patterns. In this case, one assist pattern need only be inserted (arranged) near the adjacent assist patterns. If a certain assist pattern is close to a desired pattern, it must be removed.

Seventh Embodiment

The application target of a mask generation program 414 is not particularly limited to a mask having a square contact hole pattern, and it can be applied to a mask having a rectangular contact hole pattern or line pattern. The seventh embodiment will exemplify a case in which mask data 410 having an isolated line pattern is generated using the mask generation program 414.

Pieces of P map calculation information other than effective light source information 402 and a mask function 412 are assumed to be the same as in the fifth embodiment. The effective light source (corresponding to the effective light source information 402) is assumed to use dipole illumination, as shown in FIG. 14A. Pattern data (target pattern) 401 is assumed to be an isolated line pattern, which has a width of 120 nm.

The seventh embodiment also assumes a so-called clear field with an opaque feature, in which a pattern is formed on a resist portion which is irradiated with the exposure light and exhibits a value equal to or less than a certain threshold.

The mask function 412 is set as the target pattern itself, that is, a 120-nm isolated line pattern first. In general, when a line pattern is transferred by exposure, the resist remains unremoved only in the line portion. Hence, the mask function 412 represents a mask which exhibits a background transmittance of 100% and has a light-shielding portion formed from a 120-nm isolated line pattern.

FIG. 14B shows a P map 413 calculated from the above-described pieces of P map calculation information. When assist patterns are inserted (arranged) in regions each of which exhibits a value less than a predetermined threshold and corresponds to a peak position on the P map 413 shown in FIG. 14B, imaging performance of the mask improves.

The P map 413 shown in FIG. 14B has peaks at positions about 290 nm from the center of the isolated line pattern. The use of a mask in which assist patterns are arranged at positions 290 nm from the center of the isolated line pattern improves the imaging performance, as shown in FIG. 14C. In FIG. 14C, reference symbol d indicates the distance from the center of the isolated line pattern, which is 290 nm in the seventh embodiment.

It is also possible to generate mask data 410 for a mask having an isolated line pattern even by inserting (arranging) assist patterns in the following way.

First, a P map 413 calculated as a dark field with a clear aperture is set as $PM_1(x, y)$. Note that the P map 413 is normalized assuming that the maximum value of $PM_1(x, y)$ is 1. Next, $PM_2(x, y)$ as a new P map 413 is calculated by setting $PM_2(x, y)=1-PM_1(x, y)$. Assist patterns are inserted (arranged) in regions each of which exhibits a value less than a predetermined threshold and corresponds to a peak position (or barycentric position) on $PM_2(x, y)$ calculated in this way, thereby generating mask data 410. Assist patterns which form a clear field with an opaque feature may be inserted (arranged) in regions each of which exhibits a value more than a predetermined threshold and corresponds to a peak position (or barycentric position).

Eighth Embodiment

A mask function 412 will be explained in detail in the eighth embodiment.

Pieces of P map calculation information are assumed to be the same as in the fifth embodiment. Pattern data (target pattern) 401 is assumed to be a 120-nm square isolated contact hole pattern.

FIGS. 15A and 15B show a P map 413 calculated by setting the mask function 412 as the target pattern itself. FIG. 15A shows the P map 413 itself. FIG. 15B shows a map obtained by setting each position having a positive value as 1, and setting each position having a negative value as −1 on the P map 413 shown in FIG. 15A.

FIGS. 15C and 15D show a P map 413 calculated by setting the mask function 412 as a 60-nm square isolated contact hole pattern. FIG. 15C shows the P map 413 itself. FIG. 15D shows a map obtained by setting each position having a positive value as 1, and setting each position having a negative value as −1 on the P map 413 shown in FIG. 15C.

FIGS. 15E and 15F show a P map 413 calculated by setting the mask function 412 as a 1-nm square isolated contact hole pattern. FIG. 15E shows the P map 413 itself. FIG. 15F shows a map obtained by setting each position having a positive value as 1, and setting each position having a negative value as −1 on the P map 413 shown in FIG. 15E.

When a relatively small pattern is set as the mask function 412, assist patterns are inserted (arranged) such that light converges on the small pattern, resulting in an increase in exposure margin. However, as can be understood from FIGS. 15A to 15F, the mask shape is complicated in this case. In contrast, when a relatively large pattern is set as the mask function 412, the mask shape is simple. According to the examinations of various cases by the inventor of the present invention, a pattern having a size equal to or smaller than the target pattern is desirably set as the mask function 412.

To simplify the calculation of the P map 413, the mask function 412 need only be set by approximating a contact hole pattern by a point (e.g., a 1-nm contact hole pattern), and approximating a line pattern by a line (e.g., a pattern having a width of 1 nm). If a rectangular contact hole pattern is used, a line extending in the longitudinal direction (e.g., a pattern having a length equal to that of the rectangular contact hole pattern in the longitudinal direction, and a width of 1 nm) need only be set as the mask function 412.

For example, in the fifth embodiment, a 1-nm isolated contact hole pattern need only be set as the mask function 412. In the sixth embodiment, a pattern including three 1-nm contact hole patterns need only be set as the mask function 412. In the seventh embodiment, a line pattern having a width of 1 nm need only be set as the mask function 412.

The mask function 412 is desirably a pattern having a size equal to or smaller than the target pattern, as described above. Accordingly, the reduction magnification may be preset to 0 (exclusive) to 1 (inclusive), and the product of the reduction magnification and the original dimension of the target pattern may be set as the mask function 412.

For example, if the reduction magnification is set to 0.75, a 90 nm (120 nm×0.75) isolated contact hole pattern need only be set as the mask function 412 in the fifth embodiment. A line pattern having a width of 90 nm need only be set as the mask function 412 in the seventh embodiment. Note that the fifth to seventh embodiments each exemplify a case in which the reduction magnification is set to 1.

It is generally difficult to resolve a line pattern and rectangular pattern in the widthwise direction, so attention must be paid to the pattern resolution in the widthwise direction. For this reason, the P map 413 may be calculated by setting, as the mask function 412, the product of the reduction magnification and the original dimension of the target pattern in the widthwise direction.

Ninth Embodiment

Assist patterns inserted (arranged) in regions (positions) each having a negative value on a P map 413 will be explained in the ninth embodiment.

The P map 413 includes regions having negative values. This means that there are regions which cancel the formation of an aerial image on the P map 413.

The effect of canceling the formation of an aerial image can be interpreted as inverting the phase of light (i.e., setting light to be 180° out of phase). Hence, the imaging performance of the mask can be improved by inserting (arranging) an assist pattern in each region having a negative value on the P map 413 such that light transmitted through a desired pattern becomes 180° out of phase with that transmitted through the assist pattern.

Pieces of P map calculation information are assumed to be the same as in the fifth embodiment. Pattern data (target pattern) 401 is assumed to be an isolated contact hole pattern, which has a diameter of 120 nm.

Figure 16A:
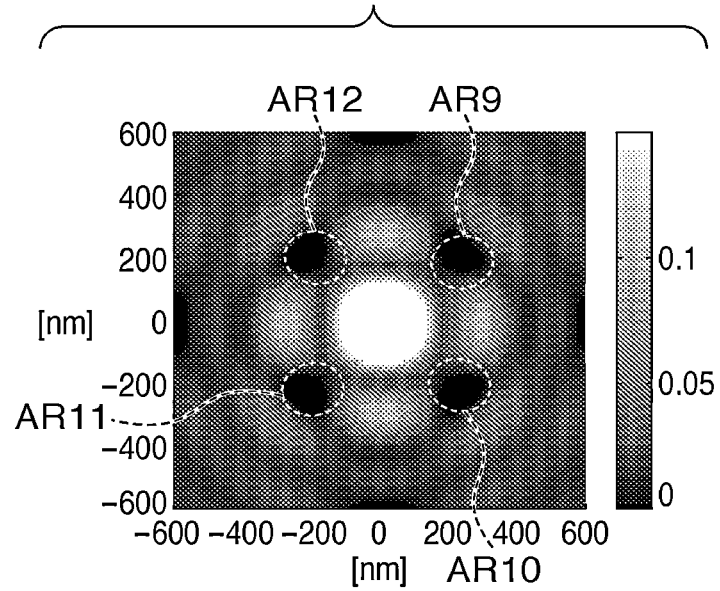
Figure 16B:
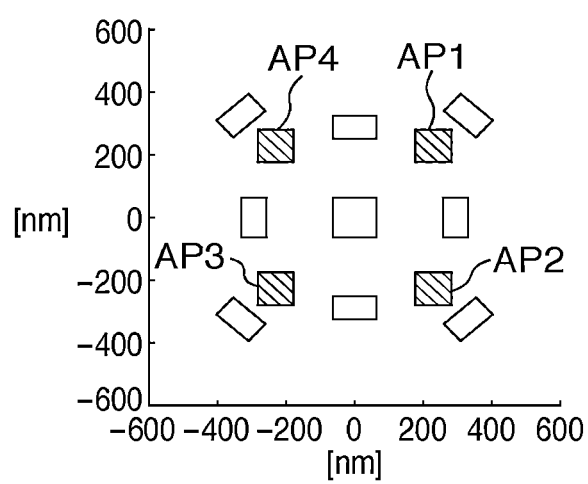

As has been described in the fifth embodiment, the P map 413 shown in FIG. 11C is calculated from the above-described pieces of P map calculation information. When assist patterns in phase (0° out of phase) with a desired pattern are inserted (arranged) in regions AR1 to AR8 surrounded by the white dotted lines shown in FIG. 11C, the imaging performance of the mask improves. Note that regions AR9 to AR12 surrounded by the white dotted lines have relatively large negative peak values on the P map 413 shown in FIG. 11C, as shown in FIG. 16A. On the P map 413 shown in FIG. 16A, the centers of the regions AR9 to AR12 surrounded by the white dotted lines lie at four positions, that is, (±225, 225) and (±225, −225). Mask data 410 shown in FIG. 16B is generated by inserting (arranging) assist patterns AP1 to AP4, that are 180° out of phase with the desired pattern, in the regions AR9 to AR12 surrounded by the white dotted lines. In FIG. 16B, the assist patterns AP1 to AP4 each are 180° out of phase with the desired pattern and have a size of 90 nm×90 nm.

Figure 17:
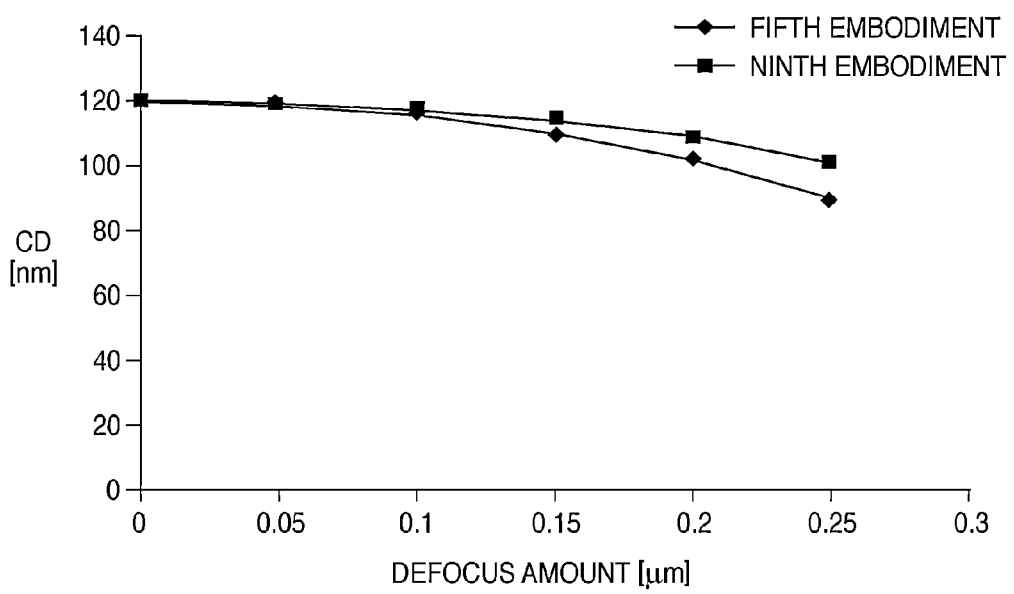
FIG. 17 is a graph showing the result of a comparison of the imaging performances of a mask based on the mask data shown in FIG. 11D (fifth embodiment), and that based on the mask data shown in FIG. 16B (ninth embodiment).

FIG. 17 is a graph showing the result of a comparison of the imaging performances of a mask based on the mask data 410 shown in FIG. 11D (i.e., according to the fifth embodiment), and that based on the mask data 410 shown in FIG. 16B (i.e., according to the ninth embodiment). In FIG. 17, the abscissa indicates the defocus amount, and the ordinate indicates the diameter of the isolated contact hole pattern (CD). The imaging performance of each mask is evaluated based on a change in the diameter of the isolated contact hole pattern (CD) with respect to a change in defocus. Referring to FIG. 17, the mask based on the mask data 410 shown in FIG. 16B exhibits an imaging performance better than that of the mask based on the mask data 410 shown in FIG. 11D.

In this manner, the mask imaging performance can be improved by inserting (arranging) assist patterns, that are 180° out of phase with the desired pattern, in regions having negative values on the P map 413. Hence, it is only necessary to insert assist patterns, that are in phase with the desired pattern, in regions each of which exhibits a value more than a positive threshold and corresponds to a peak position, and to insert assist patterns, that are 180° out of phase with the desired pattern, in regions each of which exhibits a value less than a negative threshold and corresponds to a peak position. In the ninth embodiment, the positive threshold is 0.03, and the negative threshold is −0.018.

Tenth Embodiment

As has been described in the fifth and ninth embodiments, the mask imaging performance can be improved by generating mask data 410 based on a P map 413. However, when assist patterns are inserted (arranged) faithfully to the P map 413, the mask shape is complicated. The current mask fabrication technique can fabricate a mask based on the mask data 410 shown in FIG. 11D, and that based on the mask data 410 shown in FIG. 16B. Even so, it is very useful to reduce the load imposed on the mask fabrication.

To reduce the load imposed on the mask fabrication, assist patterns almost similar to the pattern to be transferred by exposure need only be inserted in regions each of which exhibits a value more than a predetermined threshold and corresponds to a peak position on the P map 413. Because the P map 413 has a most conspicuous feature in specifying positions to insert (arrange) assist patterns, a change in the shape of each assist pattern has little influence on the mask imaging performance.

Pieces of P map calculation information are assumed to be the same as in the fifth embodiment. Pattern data (target pattern) 401 is assumed to be an isolated contact hole pattern, which has a diameter of 120 nm.

As has been described in the fifth embodiment, regions each of which exhibits a value equal to or more than the positive threshold and corresponds to a peak position on the P map 413 calculated from the above-described pieces of P map calculation information lie at eight positions, that is, (±285, 0), (0, ±285), (±320, 320), and (±320, −320). Assist patterns that are in phase with the pattern to be transferred by exposure are inserted at these eight positions. Note that each assist pattern is assumed to be similar to the isolated contact pattern as a desired pattern, and have a size of 90 nm×90 nm.

As has been described in the ninth embodiment, assist patterns, that are 180° out of phase with light diffracted by the pattern to be transferred by exposure, are inserted at four positions, that is, (±225, 225) and (±225, −225). Note that each assist pattern is assumed to be similar to the isolated contact pattern as a desired pattern to be transferred by exposure, and have a size of 90 nm×90 nm.

Figure 18:
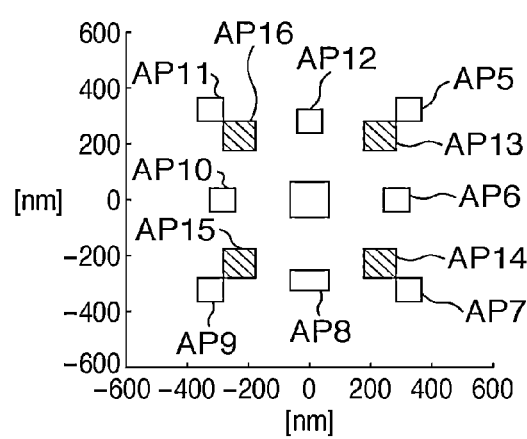
FIG. 18 is a chart showing mask data according to the tenth embodiment of the present invention.

FIG. 18 shows mask data 410 generated in this way. In FIG. 18, assist patterns AP5 to AP12 are in phase with the pattern to be transferred by exposure and are inserted (arranged) at (±285, 0), (0, ±285), (±320, 320), and (±320, −320). Assist patterns AP13 to AP16 are 180° out of phase with the pattern to be transferred by exposure and are inserted at (±225, 225) and (±225, −225). Since the assist patterns AP13 to AP16 each have a square shape (i.e., are similar to the desired pattern) on a mask based on the mask data 410 shown in FIG. 18, this mask can be fabricated more easily than a mask based on the mask data 410 shown in FIG. 16B.

FIG. 19 is a graph showing the result of a comparison of the imaging performances of a mask based on the mask data 410 shown in FIG. 16B (i.e., according to the ninth embodiment), and that based on the mask data shown in FIG. 18 (i.e., according to the 10th embodiment). Referring to FIG. 19, there is little difference in imaging performance between the mask based on the mask data 410 shown in FIG. 16B and that based on the mask data 410 shown in FIG. 18. In this manner, the load imposed on the mask fabrication can be reduced by inserting (arranging) assist patterns that are almost similar to the pattern to be transferred by exposure in regions each of which exhibits a value more than a predetermined threshold and corresponds to a peak position. In addition, a mask fabricated in this way can improve the imaging performance as compared with that fabricated according to the prior art. Each assist pattern is not particularly limited to the one almost similar to the desired pattern, and may take any form as long as it facilitates the mask fabrication.

When each assist pattern is almost similar to the pattern to be transferred by exposure, it preferably has a size around 75% that of a contact hole pattern to be transferred by exposure. The size means herein not the area but the length of one side of the pattern. For example, when a square pattern 120 nm on a side is formed on the mask to transfer a 120-nm contact hole pattern by exposure, the length of one side of each assist pattern need only be about 90 nm. Since the P map 413 appropriately specifies positions to insert (arrange) assist patterns, the insertion (arrangement) of the assist patterns leads to a considerable improvement in resolving power. It is therefore unnecessary to fix the size of each assist pattern to 75% that of the contact hole pattern to be transferred by exposure. According to the examinations of various cases by the inventor of the present invention, a sufficient effect of the insertion of assist patterns can be obtained even when they each have a size 50% to 85% that of the contact hole pattern to be transferred by exposure.

If the contact hole pattern has a rectangular shape, rectangular assist patterns need only be inserted (arranged). The short-side length of each of these assist patterns need only be 50% to 80% that of the contact hole pattern to be transferred by exposure.

If the pattern to be transferred by exposure is a line pattern, linear assist patterns need only be inserted. Since a linear pattern is resolved readily, the width of each assist pattern is preferably 35% to 70% that of the line pattern to be transferred by exposure.

Eleventh Embodiment

Multiple exposure using a P map 413 will be explained in the eleventh embodiment. Multiple exposure in a broad sense is known as one micropattern exposure method. The multiple exposure in a broad sense includes multiple exposure in a narrow sense and a plurality of times of exposure. In the multiple exposure in a narrow sense, latent image patterns are added without a development process. For example, in the representative double exposure, the mask pattern is divided into two types, that is, a dense pattern and sparse pattern, thereby performing double exposure. There is another double exposure in which a line pattern is divided into patterns in the longitudinal direction and horizontal direction, and they are individually transferred by exposure, thereby forming a desired line pattern. In contrast, in the plurality of times of exposure, latent image patterns are added through a development process. These exposure schemes are approaches to reducing the k1 factor, and will be merely referred to as "multiple exposure" hereinafter, including the multiple exposure in a narrow sense and the plurality of times of exposure.

The P map 413 includes regions having negative values, and has a function of canceling imaging (i.e., the formation of an aerial image), as described above.

Pieces of P map calculation information are assumed to be the same as in the fifth embodiment. FIG. 20 shows the defocus characteristic when assist patterns that are in phase with a desired pattern to be transferred by exposure are inserted (arranged) at positions having positive values, and that when assist patterns that are in phase with the desired pattern are inserted at positions having negative values on the P map 413 calculated from the pieces of P map calculation information. FIG. 20 also shows the defocus characteristic when there are no assist patterns. In FIG. 20, the abscissa indicates the defocus amount, and the ordinate indicates the diameter of the contact hole pattern (CD).

Referring to FIG. 20, the defocus characteristic when assist patterns are inserted (arranged) at positions having positive values is better than that when there are no assist patterns on the P map 413. However, the defocus characteristic when assist patterns are inserted (arranged) at positions having negative values is poorer than that when there are no assist patterns on the P map 413. In this manner, FIG. 20 reveals that increasing the number of assist patterns arranged around the pattern to be transferred by exposure is not always beneficial unlike the conventional concept.

Positions having negative values on the P map 413 represent a forbidden pitch. The positions having negative values on the P map 413 are vectors, which depend on the distance and direction. In this case, four vectors, that is, (±225, 225) and (±225, −225) represent a forbidden pitch. These vectors each point the direction from the origin to a region which exhibits a coherence equal to or lower than a threshold on the P map 413.

When pattern data 401 is divided so as to avoid a forbidden pitch assuming the vectors representing the forbidden pitch as reference vectors, final pattern data 401 free from any forbidden pitch can be generated.

Figure 21:
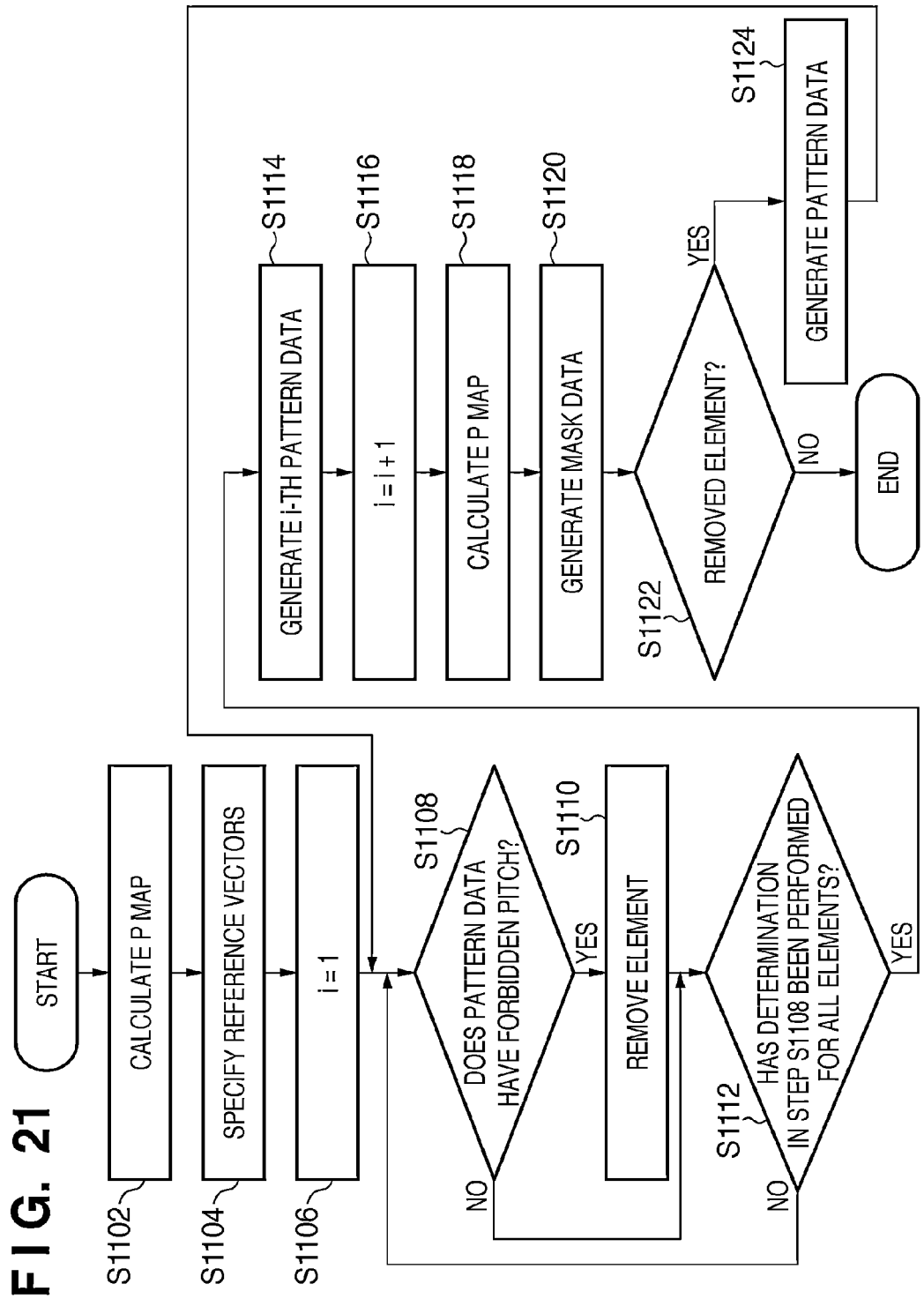
FIG. 21 is a flowchart for explaining a process of generating pattern data free from any forbidden pitch by a mask generation program.

A process of generating pattern data 401 free from any forbidden pitch by a mask generation program 414 will be explained in detail with reference to FIG. 21. Pieces of P map calculation information are assumed to be input in advance via an input unit 50 by the user and stored in a storage unit 40. Also, the mask generation program 414 is assumed to be installed from a storage medium 70 connected to a medium interface 60 and stored in the storage unit 40 via a control unit 20. The mask generation program 414 is started up in response to a start-up command input from the input unit 50 by the user and executed by the control unit 20.

In step S1102, the control unit 20 calculates the P map 413 based on the pieces of P map calculation information. Note that a mask function 412 is set based not on the entire pattern data (target pattern) 401 but on its one element. More specifically, a mask function 412 is set by performing a predetermined process for one element of the target pattern (e.g., multiplying it by a reduction magnification).

In step S1104, the control unit 20 specifies reference vectors representing a forbidden pitch from the P map 413 calculated in step S1102. More specifically, reference vectors are specified by extracting vector quantities each from the origin to a region which exhibits a coherence equal to or lower than a threshold and corresponds to a negative peak on the P map 413.

In step S1106, the control unit 20 sets an initial value "1" to a reference number i of pattern data 401 generated in a step to be described later. Pattern data having the reference number i will be referred to as the i-th pattern data hereinafter.

In step S1108, the control unit 20 checks whether the pattern data 401 has a forbidden pitch. More specifically, the control unit 20 checks whether, when an element of interest is selected from a plurality of elements of the pattern data 401, and reference vectors are set assuming the center of the selected element of interest as the start point, an element exists near the end point of any of the reference vectors. If the control unit 20 determines that an element exists near the end point of any of the reference vectors, it determines that the pattern data 401 has a forbidden pitch. If the control unit 20 determines that no element exists near the end point of any of the reference vectors, it determines that the pattern data 401 has no forbidden pitch.

If the control unit 20 determines that the pattern data 401 has a forbidden pitch, it advances the process to step S1110; otherwise, it advances the process to step S1112.

In step S1110, the control unit 20 removes the element near the end point of any of the reference vectors from the pattern data 401, and temporarily stores information on the removed element in a cash memory.

In step S1112, the control unit 20 checks whether the determination in step S1108 has been performed for all the elements which are not removed in step S1110 of the plurality of elements of the pattern data 401.

If the control unit 20 determines that the determination in step S1108 has been performed for all the elements, it advances the process to step S1114; otherwise, it returns the process to step S1108.

In step S1114, the control unit 20 generates the i-th pattern data (i-th data generation step). More specifically, if i=1, the control unit 20 determines, as the i-th pattern data, pattern data obtained by removing all the elements near the end points of the reference vectors from the pattern data 401. If i≥2, the control unit 20 determines, as the i-th pattern data, pattern data obtained by removing all the elements near the end points of the reference vectors from the (i−1)-th pattern data.

In step S1116, the control unit 20 newly sets a value obtained by incrementing the reference number i of the pattern data by 1 as i.

In step S1118, the control unit 20 calculates the P map 413. More specifically, the control unit 20 calculates the P map 413 as the preliminary step toward inserting (arranging) assist patterns in the pattern data 401. In step S1118, the mask function 412 is set based on all the elements of the i-th pattern data. In other words, the mask function 412 is set by performing a predetermined process for all the elements of the i-th pattern data (e.g., multiplying them by a reduction magnification), thereby calculating the P map 413. Because the mask function 412 obtained in step S1102 is different from that obtained in step S1118, different P maps 413 must be calculated in steps S1102 and S1118.

In step S1120, the control unit 20 generates mask data 410 by inserting (arranging) assist patterns. More specifically, assist patterns are inserted (arranged) in regions each of which exhibits a value more than a predetermined threshold and corresponds to a peak position, based on the P map 413 calculated in step S1118. The control unit 20 then determines data, which is obtained by including information on the assist patterns in the mask data 410, as new mask data 410. At this time, the control unit 20 may display the mask data 410 on a display unit 30 in place of the pattern data 401.

In step S1122, the control unit 20 checks whether there is an element removed from the pattern data 401 by referring to the cash memory.

If the control unit 20 determines that there is an element removed from the pattern data 401, it advances the process to step S1124; otherwise, it ends the process.

In step S1124, the control unit 20 generates pattern data 401, which includes the element removed in generating the i-th pattern data, as a new process target (second data generation step).

Figure 22A:
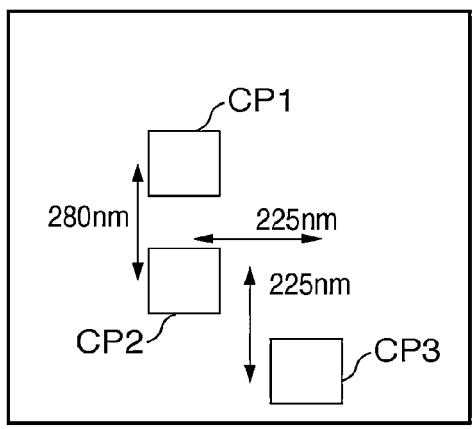

An example of the division of the pattern data 401 using the P map 413 will be shown. Pieces of P map calculation information are assumed to be the same as in the fifth embodiment. Consider a case in which pattern data 401 shown in FIG. 22A is the process target. The pattern data 401 shown in FIG. 22A has three contact holes CP1 to CP3. The size (diameter) of each of the contact holes CP1 to CP3 is 120 nm.

The contact hole CP2 is spaced apart from the contact hole CP1 by −280 nm in the y direction. The contact hole CP3 is spaced apart from the contact hole CP2 by 225 nm in the x direction and by −225 nm in the y direction.

The control unit 20 calculates the P map 413 by setting one element (i.e., one of the three contact holes CP1 to CP3) as the mask function 412. In this embodiment, the contact hole CP1 is set as the mask function 412. The P map 413 has positive peaks at the positions (±280, 0) and (0, ±280) on the mask. Also, the P map 413 has negative peaks at the positions (±225, 225) and (±225, −225) on the mask.

The control unit 20 specifies reference vectors representing, for example, a forbidden pitch from the P map 413. At this time, there are four reference vectors (225, 225), (225, −225), (−225, 225), and (−225, −225).

The control unit 20 selects the contact hole (element) CP2 as the element of interest assuming the pattern data 401 shown in FIG. 22A as the process target. In this case, when the reference vectors are set assuming the position of the selected contact hole CP2 as the element of interest as the start point, the contact hole (element) CP3 exists near the end point of one of the reference vectors. Therefore, the contact holes CP2 and CP3 have a forbidden pitch relationship.

Figure 22B:
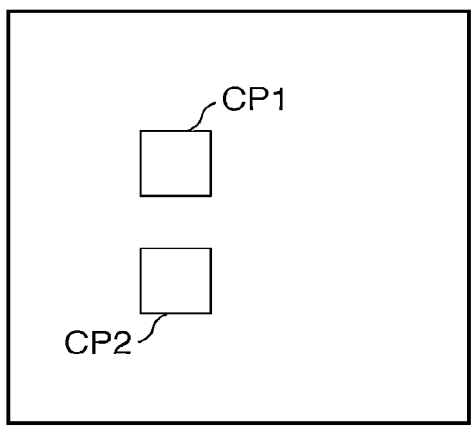
Figure 22C:
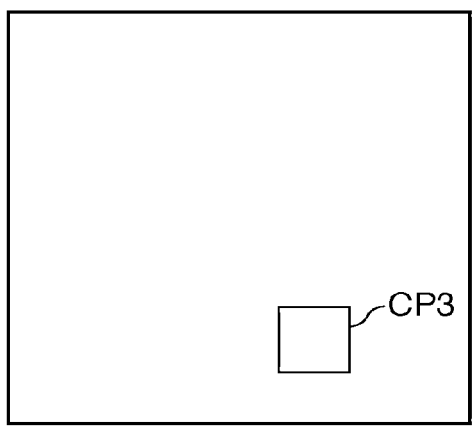

To cancel this state, the control unit 20 removes the contact hole (element) CP3 near the end point of one of the reference vectors from the pattern data 401 shown in FIG. 22A to generate the first pattern data shown in FIG. 22B. The control unit 20 also generates the second pattern data shown in FIG. 22C from the contact hole (element) CP3. With this operation, the pattern data 401 shown in FIG. 22C is divided into the first pattern data shown in FIG. 22B and the second pattern data shown in FIG. 22C. This division can generate mask data for two masks free from any forbidden pitches.

As has been described in the fifth and ninth embodiments, the insertion (arrangement) of assist patterns based on the P map 413 improves the imaging performance of the mask. Hence, by inserting (arranging) best suited assist patterns in the first pattern data shown in FIG. 22B and the second pattern data shown in FIG. 22C to generate the pattern data shown in FIGS. 22D and 22E, the imaging performance can be improved as compared with simple double exposure.

Figure 22D:
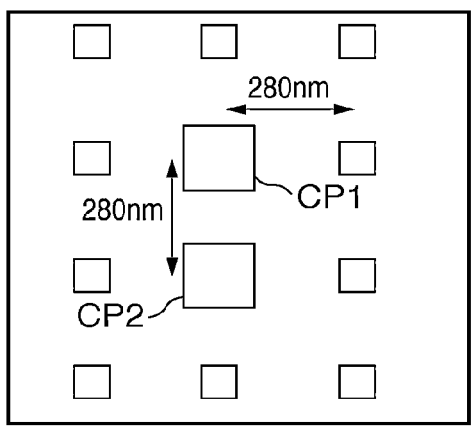
Figure 22E:
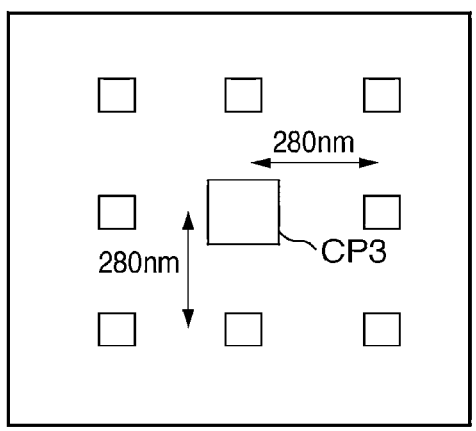

When the mask data shown in FIGS. 22D and 22E are input to an EB drawing device, two masks based on them are fabricated. When double exposure is performed using these two masks, contact holes CP1 to CP3 can be formed with a higher accuracy than when the exposure is performed using a mask identical to the pattern data shown in FIG. 22A.

Twelfth Embodiment

The optimization of the effective light source will be explained in the twelfth embodiment. In the optimization of the effective light source, it need only be determined such that peaks (regions each of which exhibits a value equal to or more than a predetermined threshold) on a P map 413 match the positions of elements of pattern data 401.

Pieces of P map calculation information other than effective light source information 402 are assumed to be the same as in the fifth embodiment. Consider the optimization of the effective light source for pattern data (target pattern) 401 having three contact holes CP11 to CP13, as shown in FIG. 23A. The three contact holes CP11 to CP13 are arranged at an interval dd=300 nm. The size of each of the three contact holes CP11 to CP13 is 120 nm.

Figure 23B:
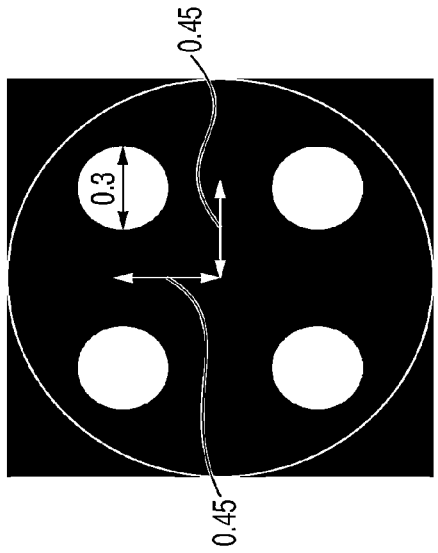
Figure 23A:
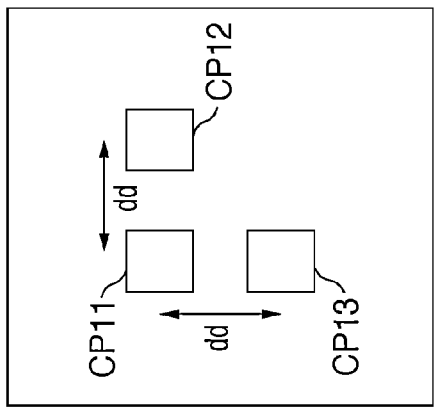

FIG. 23B is a chart showing the initial value of the effective light source (effective light source information 402). In FIG. 23B, the white circular line indicates σ=1, and the white regions indicate light irradiation portions. The pupil coordinate system is normalized such that the distance from the center of the circle to the center of each pole (light irradiation portion) in the x direction is set to 0.45 and that in the y direction is set to 0.45, and the diameter of each pole (light irradiation portion) is set to 0.3.

Figure 23D:
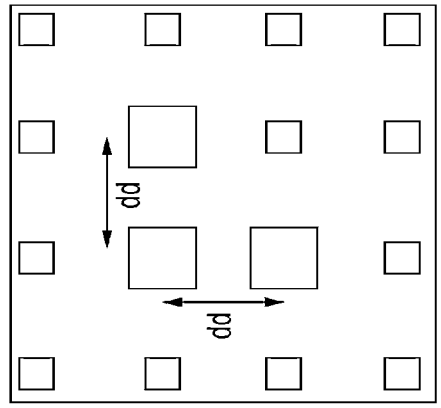
Figure 23C:
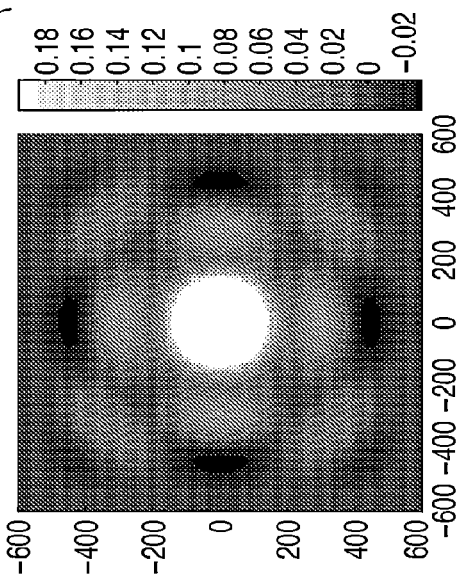

Based on the initial value of the effective light source shown in FIG. 23B, a control unit 20 calculates a P map 413 shown in FIG. 23C. The P map 413 shown in FIG. 23C has positive peaks at the positions (0, ±300) and (±300, 0). The P map 413 shown in FIG. 23C is suited to a mask based on the pattern data 401 shown in FIG. 23A. This is because the interval dd between adjacent contact holes is 300 nm on the mask based on the pattern data 401 shown in FIG. 23A.

The control unit 20 calculates a new P map 413 by re-setting a mask function 412 (e.g., by setting the mask function 412 as the target pattern itself). When assist patterns are inserted (arranged) in regions each of which exhibits a value equal to or more than a predetermined threshold and corresponds to a peak position on the P map 413, mask data 410 as shown in FIG. 23D can be obtained. The use of a mask based on the mask data 410 shown in FIG. 23D allows forming contact holes CP11 to CP13 with high accuracy.

Figure 24:
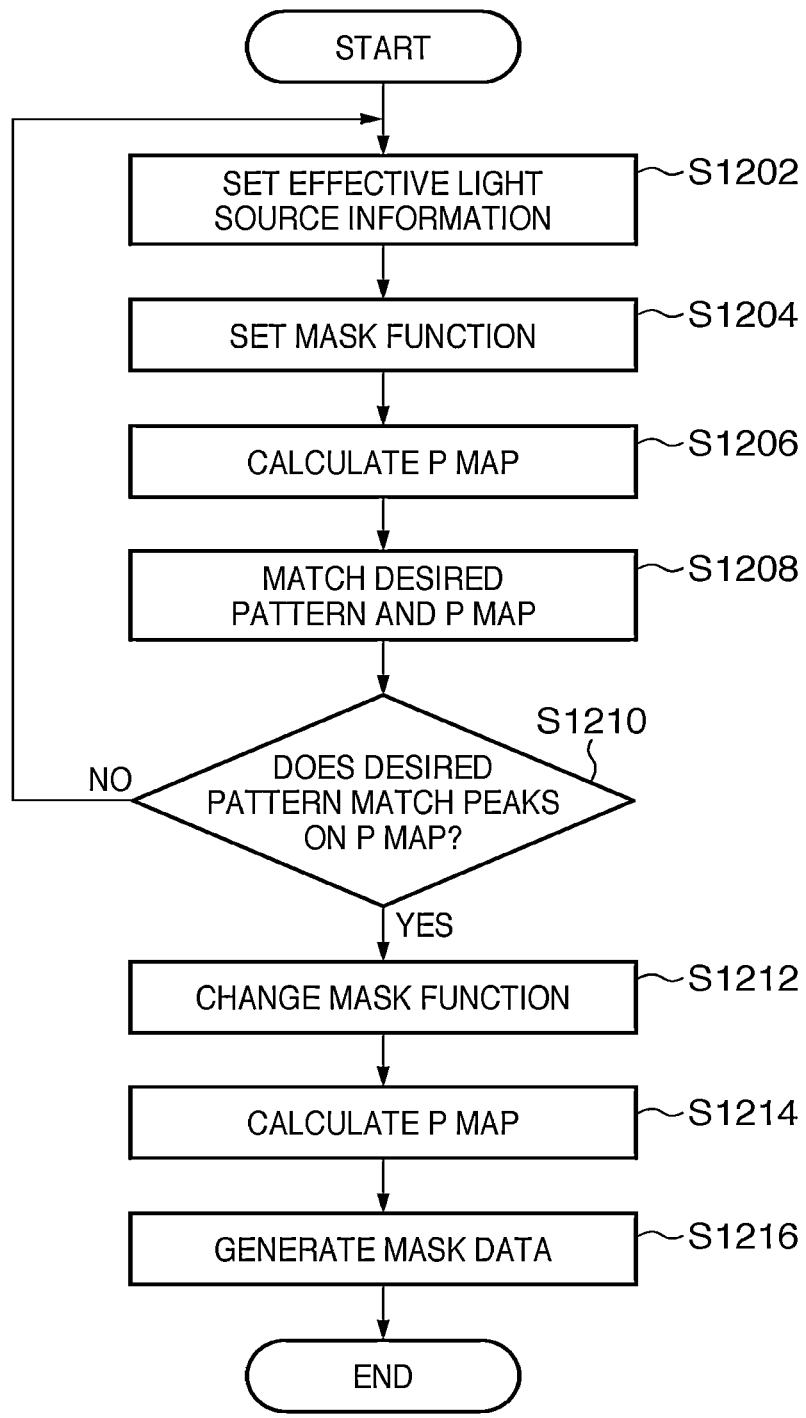
FIG. 24 is a flowchart for explaining a mask data generation process by a mask generation program.

FIG. 24 is a flowchart for explaining a process of generating mask data 410 by a mask generation program 414.

In step S1202, the control unit 20 sets the effective light source information 402.

In step S1204, the control unit 20 sets the mask function 412. Note that the mask function 412 is set based not on the entire target pattern but on its one element. The mask function 412 is set by performing a predetermined process for the one element (e.g., multiplying it by a reduction magnification).

In step S1206, the control unit 20 calculates the P map 413 based on the mask function 412 set in step S1204.

In step S1208, the control unit 20 matches the P map 413 and the contact holes CP11 to CP13 as a desired pattern to be transferred by exposure.

In step S1210, the control unit 20 determines whether the contact holes CP11 to CP13 as a desired pattern match peaks (regions each of which exhibits a value equal to or more than a predetermined threshold) on the P map 413. If the control unit 20 determines that the contact holes CP11 to CP13 as a desired pattern match peaks, it advances the process to step S1212. If the control unit 20 determines that the contact holes CP11 to CP13 as a desired pattern does not match peaks on the P map 413, it returns the process to step S1202.

In step S1212, the control unit 20 changes the mask function 412. Although the mask function 412 is set by paying attention to one element of the target pattern in step S1204, all the elements of the target pattern are set as the mask function 412. For this purpose, the mask function 412 is set by performing a predetermined process for all the elements of the target pattern (e.g., multiplying them by a reduction magnification).

In step S1214, the control unit 20 calculates the P map 413 based on the mask function 412 set in step S1212.

In step S1216, the control unit 20 inserts (arranges) assist patterns based on the P map 413 calculated in step S1214 to generate mask data 410, and ends the process.

To optimize the effective light source, it is necessary to repeat (i.e., loop) steps S1202 to S1210 shown in FIG. 24. The initial setting of the effective light source (effective light source information 402) is important to quickly complete the loop of steps S1201 to S1210. A method of easily calculating the initial setting of the effective light source, which can quickly complete the loop of steps S1201 to S1210, in a short period of time will be explained below.

Light diffracted by the mask pattern forms a diffracted light distribution on the pupil plane of the projection optical system. Let a(f, g) be the amplitude of the diffracted light, as described above. The coordinates (f, g) on the pupil plane of the projection optical system are also normalized assuming that the pupil size (pupil diameter) of the projection optical system is 1, as described above. Let circ(f−f', g−g') be a function which takes 1 for positions that fall within a circle with a radius of 1 and a center at (f', g'), and takes 0 for other positions. Let w(f, g) be the weighting function of the diffracted light.

First, the control unit 20 calculates a multiple integral:

$$S_{raw}(f,g) = \iint w(f,g) a(f,g) \text{circ}(f-f',g-g') df' dg' \quad (35)$$

for $|f'| \leq 2$ and $|g'| \leq 2$.

Next, the control unit 20 calculates:

$$S(f,g) = S_{raw}(f,g) \text{circ}(f,g) \quad (36)$$

Lastly, the control unit 20 determines S(f, g) calculated from equation (36) as the setting value of the effective light source.

Figure 25A:
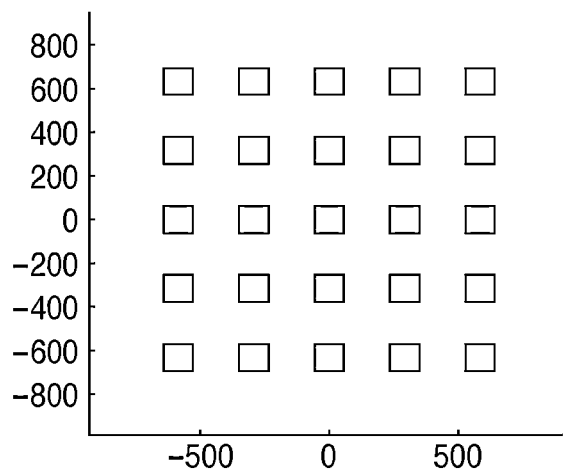

For example, consider pattern data 401 in which contact hole patterns of 5 rows and 5 columns are two-dimensionally arrayed at a cycle of 300 nm, as shown in FIG. 25A. In FIG. 25A, the ordinate indicates the y-coordinate on the mask surface (unit: nm), and the abscissa indicates the x-coordinate on the mask surface (unit: nm). The 12th embodiment also assumes a case in which an exposure apparatus uses a projection optical system having an NA of 0.73 (corresponding to NA information 403), and exposure light having a wavelength of 248 nm (corresponding to λ information 404).

Figure 25B:
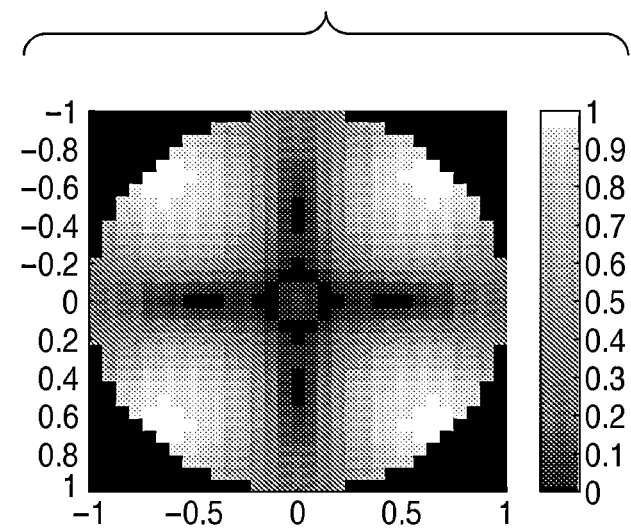

The control unit 20 calculates the function S(f, g) describing the effective light source, based on equations (35) and (36). FIG. 25B shows the effective light source described by the function S(f, g) calculated by the control unit 20. In this embodiment, the weighting function w(f, g) is assumed to be a quadratic function which satisfies (0, 0)=0.1 and w(2, 2)=1. In FIG. 25B, the ordinate indicates the coherence factor σ in the x direction, and the abscissa indicates the coherence factor σ in the y direction.

Referring to FIG. 25B, the effective light source described by the function S(f, g) changes continuously. The effective light source shown in FIG. 25B is close to that shown in FIG. 23B. Hence, the effective light source shown in FIG. 25B is suitable as the initial value of the effective light source information 402 (the setting value of the effective light source) set in step S1202 in the loop of steps S1202 to S1210.

Thirteenth Embodiment

An exposure apparatus 100 which executes an exposure process using a mask 130 fabricated based on mask data 410 generated in one of the above-described embodiments will be explained in the thirteenth embodiment. Note that FIG. 26 is a schematic block diagram showing the arrangement of the exposure apparatus 100.

The exposure apparatus 100 is an immersion exposure apparatus which transfers the pattern of the mask 130 onto a wafer 150 by exposure using the step & scan scheme via a liquid LW supplied between a projection optical system 140 and the wafer 150. However, the exposure apparatus 100 can adopt the step & repeat scheme or another exposure scheme.

Figure 26:
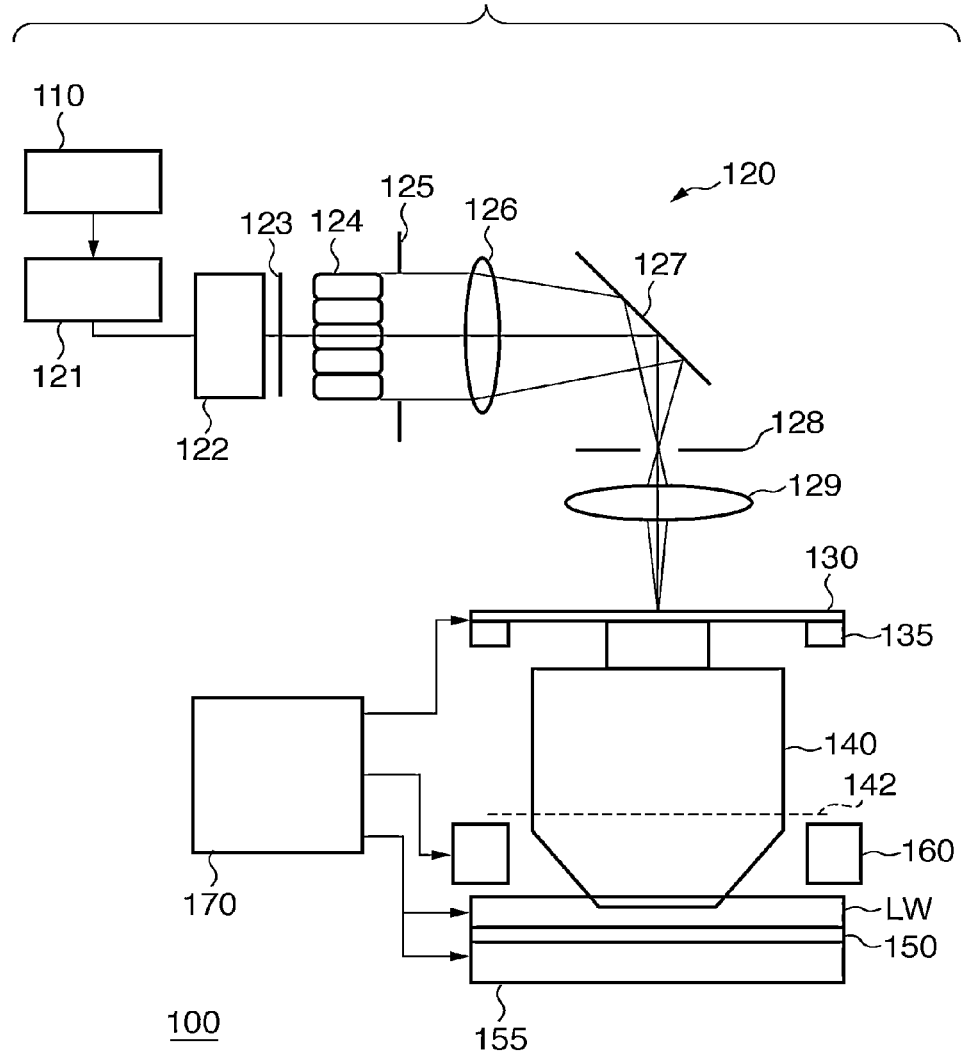
FIG. 26 is a schematic block diagram showing the configuration of an exposure apparatus according to one aspect of the present invention.

As shown in FIG. 26, the exposure apparatus 100 includes a light source 110, an illumination optical system 120, a mask stage 135 for mounting the mask 130, the projection optical system 140, a wafer stage 155 for mounting the wafer 150, a liquid supply/recovery unit 160, and a main control system 170. The light source 110 and illumination optical system 120 constitute an illumination apparatus which illuminates the mask 130 on which a circuit pattern to be transferred is formed.

The light source 110 is an excimer laser such as an ArF excimer laser having a wavelength of about 193 nm or a KrF excimer laser having a wavelength of about 248 nm. However, the type and number of light sources 110 are not particularly limited. For example, an $F_2$ laser having a wavelength of about 157 nm can also be used as the light source 110.

The illumination optical system 120 illuminates the mask 130 with light from the light source 110. In this embodiment, the illumination optical system 120 includes a beam shaping optical system 121, condensing optical system 122, polarization control unit 123, optical integrator 124, and aperture stop 125. The illumination optical system 120 also includes a condenser lens 126, bending mirror 127, masking blade 128, and imaging lens 129. The illumination optical system 120 can implement various illumination modes such as the conventional illumination and modified illumination (e.g., quadrupole illumination and dipole illumination) shown in FIGS. 4A and 14A.

The beam shaping optical system 121 is, for example, a beam expander including a plurality of cylindrical lenses. The beam shaping optical system 121 converts the horizontal to vertical ratio of the sectional shape of collimated light from the light source 110 into a predetermined value (e.g., converts the sectional shape from a rectangle to a square). In this embodiment, the beam shaping optical system 121 shapes the light from the light source 110 into that having a size and an angle of divergence required to illuminate the optical integrator 124.

The condensing optical system 122 includes a plurality of optical elements, and efficiently guides the light shaped by the beam shaping optical system 121 to the optical integrator 124. The condensing optical system 122 includes, for example, a zoom lens system, and adjusts the shape and angle of the light which enters the optical integrator 124.

The polarization control unit 123 includes, for example, a polarizing element, and is set at a position nearly conjugate to a pupil plane 142 of the projection optical system 140. The polarization control unit 123 controls the polarization state of a predetermined region of an effective light source formed on the pupil plane 142 of the projection optical system 140.

The optical integrator 124 has a function of uniforming illumination light which illuminates the mask 130, converting the angular distribution of its incident light into a positional distribution, and outputting the obtained light. The optical integrator 124 is, for example, a fly-eye lens having its incident surface and exit surface which hold a Fourier transform relationship. The fly-eye lens is formed by combining a plurality of rod lenses (i.e., microlens elements). However, the optical integrator 124 is not particularly limited to a fly-eye lens, and may be, for example, a cylindrical lens array plate in which sets of optical rods and diffraction gratings are arrayed to be orthogonal to each other.

The aperture stop 125 is set at a position which is immediately after the exit surface of the optical integrator 124 and is nearly conjugate to an effective light source formed on the pupil plane 142 of the projection optical system 140. The aperture shape of the aperture stop 125 corresponds to a light intensity distribution (i.e., an effective light source) formed on the pupil plane 142 of the projection optical system 140. In other words, the aperture stop 125 controls the effective light source. The aperture stop 125 can be switched in accordance with the illumination modes. Without an aperture stop, an effective light source may be formed by setting a diffractive optical element (e.g., a CGH (Computer Generated Hologram)) and a prism (e.g., a conical prism) at the preceding stage of the optical integrator 124.

The condenser lens 126 converges the light beam which has emerged from a secondary light source formed near the exit surface of the optical integrator 124 and passed through the aperture stop 125, and uniformly illuminates the masking blade 128 with it via the bending mirror 127.

The masking blade 128 is set at a position nearly conjugate to the mask 130, and is formed from a plurality of movable light-shielding plates. The masking blade 128 forms a nearly rectangular opening corresponding to the effective area of the projection optical system 140. The light beam which has passed through the masking blade 128 is used as illumination light which illuminates the mask 130.

The imaging lens 129 forms, on the mask 130, an image of the light beam which has passed through the opening of the masking blade 128.

The mask 130 is fabricated by a mask fabrication device such as an EB drawing device based on mask data generated by the processing apparatus 1 (mask generation program) described above, and has a circuit pattern to be transferred and assist patterns. The pattern of the mask 130 may include a pattern other than the mask pattern generated by the above-described mask generation program. The mask 130 is supported and driven by the mask stage 135. Diffracted light generated by the mask 130 is projected onto the wafer 150 via the projection optical system 140. The mask 130 and wafer 150 are set to have an optically conjugate relationship. Since the exposure apparatus 100 is of the step & scan scheme, it transfers the circuit pattern to be transferred of the mask 130 onto the wafer 150 by synchronously scanning them. When the exposure apparatus 100 is of the step & repeat scheme, it performs exposure while the mask 130 and wafer 150 stay still.

The mask stage 135 supports the mask 130 via a mask chuck, and is connected to a driving mechanism (not shown). The driving mechanism (not shown) is formed from, for example, a linear motor, and drives the mask stage 135 in the X-, Y-, and Z-axis directions and the rotation directions about the respective axes. Note that the scanning direction of the mask 130 or wafer 150 on its surface is defined as the Y-axis direction, a direction perpendicular to it is defined as the X-axis direction, and a direction perpendicular to the surface of the mask 130 or wafer 150 is defined as the Z-axis direction.

The projection optical system 140 projects the circuit pattern of the mask 130 onto the wafer 150. The projection optical system 140 can be a dioptric system, catadioptric system, or catoptric system. The final lens (final surface) of the projection optical system 140 is coated with a coating for reducing the influence on it exerted by the liquid LW supplied from the liquid supply/recovery unit 160 (for protection).

The wafer 150 is a substrate onto which the circuit pattern of the mask 130 is projected (transferred). However, the wafer 150 can be substituted by a glass plate or another substrate. The wafer 150 is coated with a resist.

The wafer stage 155 supports the wafer 150 and moves it in the X-, Y-, and Z-axis directions and the rotation directions about the respective axes using a linear motor, like the mask stage 135.

The liquid supply/recovery unit 160 has a function of supplying the liquid LW to the space between the wafer 150 and the final lens (final surface) of the projection optical system 140. The liquid supply/recovery unit 160 also has a function of recovering the liquid LW supplied to the space between the wafer 150 and the final lens of the projection optical system 140. A substance which has a high transmittance with respect to the exposure light, prevents dirt from adhering on the projection optical system 140 (on its final lens), and matches the resist process is selected as the liquid LW.

The main control system 170 includes a CPU and memory and controls the operation of the exposure apparatus 100. For example, the main control system 170 is electrically connected to the mask stage 135, wafer stage 155, and liquid supply/recovery unit 160, and controls the synchronous scanning between the mask stage 135 and the wafer stage 155. The main control system 170 also controls the switching among the supply, recovery, and supply/recovery stop of the liquid LW, based on, for example, the scanning direction and velocity of the wafer stage 155 in exposure. The main control system 170 receives effective light source information in one of the above-described embodiments, and controls the aperture stop, diffractive optical element, and prism to form an effective light source. The effective light source information may be input to the main control system 170 by the user or by transmitting the effective light source information from the processing apparatus 1 to the exposure apparatus 100 by connecting the processing apparatus 1 and exposure apparatus 100 to allow data communication between them. If the processing apparatus 1 and exposure apparatus 100 are connected to allow data communication between them, the exposure apparatus 100 includes a known data reception unit and the processing apparatus 1 includes a known data transmission unit.

Although the processing apparatus 1 described above can be a computer arranged outside the exposure apparatus 100, the main control system 170 can have the function of the processing apparatus 1 described above, instead. In this case, the main control system 170 can calculate a light intensity distribution (aerial image), which is formed on the wafer surface, using a P operator in a shorter period of time. In other words, the main control system 170 can improve the speed of partial coherent imaging calculation, thus shortening the time taken for the model-based RET. Hence, the exposure apparatus 100 can optimize the exposure conditions (e.g., optimize the effective light source for the mask 130) in a short period of time, thus improving the throughput. The main control system 170 also can generate mask data which exhibits an imaging performance more excellent than in the prior art using a P map.

In exposure, a light beam emitted by the light source 110 illuminates the mask 130 by the illumination optical system 120. The light beam which reflects the circuit pattern of the mask 130 upon being transmitted through it forms an image on the wafer 150 via the liquid LW by the projection optical system 140. The exposure apparatus 100 has an excellent imaging performance and can provide devices (e.g., a semiconductor device, an LCD device, an image sensing device (e.g., a CCD), and a thin-film magnetic head) with high throughput and a good economical efficiency. These devices are fabricated by a step of exposing a substrate (e.g., a wafer or glass plate) coated with a resist (photosensitive agent) using the exposure apparatus 100, a step of developing the exposed substrate, and other known steps.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A computer-implemented method of generating data of a pattern of a mask used for a mask manufacturing method for manufacturing the mask, the method of generating the data comprising:
   a division step of dividing an effective light source formed on a pupil plane of a projection optical system of an exposure apparatus into a plurality of point sources;
   a pupil function generation step of generating, for each of the plurality of point sources, a shifted pupil function by shifting a pupil function describing a pupil of the projection optical system by a shift amount in accordance with a position of each point source;
   a defining step of defining a matrix by arranging each shifted pupil function generated in the pupil function generation step in each row or each column of the matrix;
   a first calculation step of performing singular value decomposition of the matrix defined in the defining step, thereby calculating an eigenvalue and an eigenfunction;
   a second calculation step of calculating a map representing, when elements of a target pattern are inserted on an object plane of the projection optical system, an influence the elements inflict on each other, based on a distribution of the light diffracted by the target pattern, and the eigenvalue and the eigenfunction calculated in the first calculation step; and
   a data generation step of generating the data of the pattern of the mask based on the map calculated in the second calculation step,
   wherein the mask manufacturing method comprises a step of manufacturing the mask by forming the pattern corresponding to the generated data on a substrate.

2. The method according to claim 1, wherein in the pupil function generation step, the pupil function is shifted by the shift amount equal to a difference between the central position of the pupil of the projection optical system and the position of each point source.

3. The method according to claim 1, wherein the plurality of shifted pupil functions includes information representing an aberration of the projection optical system.

4. The method according to claim 1, wherein, in the pupil function generation step, the plurality of shifted pupil functions are arranged one-dimensionally.

5. The method according to claim 1, wherein the plurality of shifted pupil functions includes information representing at least one of a polarization state of the light which illuminates the mask, a variation in light intensity of an effective light source of the illumination optical system, and a diffraction efficiency of the mask.

6. The method according to claim 1, wherein in the data generation step, when regions determined based on a threshold of the map do not match positions of a plurality of elements of the target pattern assuming data of the target pattern as a process target, the effective light source is newly set, and data of the pattern of the mask is generated based on the newly set effective light source.

7. The method according to claim 1, wherein the data generation step includes:
   a specifying step of specifying a reference vector from an origin to a region which exhibits a value not more than a threshold on the map calculated in the second calculation step;
   a first data generation step of selecting one of a plurality of elements of the target pattern, and removing, when the reference vector is set assuming the center of the element as a start point, an element at a position which matches an end point of the reference vector, thereby generating first pattern data; and
   a second data generation step of generating second pattern data formed from the element removed in the first data generation step.

8. The method according to claim 7, wherein in the data generation step, the first data generation step and the second data generation step are repeated.

9. A non-transitory tangible computer-readable medium storing a program for making a computer execute a process of generating data of a pattern of a mask used for a mask manufacturing method for manufacturing the mask, the program making the computer execute:
   a division step of dividing an effective light source formed on a pupil plane of a projection optical system of an exposure apparatus into a plurality of point sources;
   a generation step of generating, for each of the plurality of point sources, a shifted pupil function by shifting a pupil function describing a pupil of the projection optical system by a shift amount in accordance with a position of each point source;
   a defining step of defining a matrix by arranging each shifted pupil function generated in the generation step in each row or each column of the matrix;
   a first calculation step of performing singular value decomposition of the matrix defined in the defining step, thereby calculating an eigenvalue and an eigenfunction;
   a second calculation step of calculating a map representing, when elements of a target pattern are inserted on an object plane of the projection optical system, an influence the elements inflict on each other, based on a distribution of the light diffracted by the target pattern, and the eigenvalue and the eigenfunction calculated in the first calculation step; and a data generation step of generating the data of the pattern of the mask based on the map calculated in the second calculation step, wherein the mask manufacturing method comprises a step of manufacturing the mask by forming the pattern corresponding to the generated data on a substrate.

10. A mask fabrication method comprising:

generating data of a pattern of a mask using a generation method defined in claim 1; and fabricating the mask using generated data of the pattern of the mask.

11. An exposure method comprising steps of:

illuminating a mask fabricated by a mask fabrication method defined in claim 10; and projecting an image of a pattern of the mask onto a substrate via a projection optical system.

12. A device manufacturing method comprising steps of:

exposing a substrate by an exposure method defined in claim 11; and processing the exposed substrate.

13. The method according to claim 1, wherein, in the defining step, each row or each column of the matrix is a vector in which the pupil of the projection optical system is shifted in accordance with the position of each point source on the effective light source.

14. The method according to claim 1, wherein a light intensity distribution formed on the pupil plane of the projection optical system while no mask is inserted on the object plane of the projection optical system is called the effective light source.

* * * * *